(12) United States Patent
Park et al.

(10) Patent No.: US 11,730,065 B2
(45) Date of Patent: Aug. 15, 2023

(54) MAGNETIC DEVICE WITH GATE ELECTRODE

(71) Applicant: KOREA ADVANCED INSTITUTE OF SCIENCE AND TECHNOLOGY, Daejeon (KR)

(72) Inventors: Byong Guk Park, Daejeon (KR); Min-Gu Kang, Daejeon (KR); Jong-Guk Choi, Gongju-si (KR)

(73) Assignee: Korea Advanced institute of Science and Technology, Daejeon (KR)

( * ) Notice: Subject to any disclaimer, the term of this patent is extended or adjusted under 35 U.S.C. 154(b) by 80 days.

(21) Appl. No.: 17/359,822

(22) Filed: Jun. 28, 2021

(65) Prior Publication Data
US 2022/0149268 A1    May 12, 2022

(30) Foreign Application Priority Data
Nov. 6, 2020 (KR) .................. 10-2020-0147207

(51) Int. Cl.
*G11C 11/00* (2006.01)
*H10N 52/80* (2023.01)
(Continued)

(52) U.S. Cl.
CPC ........... *H10N 52/80* (2023.02); *G11C 11/161* (2013.01); *G11C 11/1673* (2013.01);
(Continued)

(58) Field of Classification Search
CPC ....... H01L 43/04; H01L 27/222; H01L 43/06; G11C 11/161; G11C 11/1673; G11C 11/1675; G11C 11/18
(Continued)

(56) References Cited

U.S. PATENT DOCUMENTS 9,559,698 B2    1/2017  Nikonov et al.
9,589,616 B2 *  3/2017  Meng .................. H01L 43/08
(Continued)

FOREIGN PATENT DOCUMENTS

KR    2016-0064077 A    6/2016
KR    2020-0121482 A    10/2020

OTHER PUBLICATIONS

Young-Wan Oh et al., Field-free switching of perpendicular magnetization through spin-orbit torque in antiferromagnet/ferromagnet/oxide structures, Nature Nanotech 11, 878, 2016.
(Continued)

*Primary Examiner* — Viet Q Nguyen
(74) *Attorney, Agent, or Firm* — Harness, Dickey & Pierce, P.L.C.

(57) ABSTRACT

Provided is a magnetic device including a conductive layer extended in a first direction and providing a spin Hall effect on a placement plane defined by the first direction and a second direction, a free layer disposed on the conductive layer, a fixed layer disposed on a portion of the free layer, a tunnel barrier layer disposed between the free layer and the fixed layer, a first electrode disposed on the fixed layer, a first charge storage layer disposed on the free layer so as not to overlap the fixed layer, and a first gate electrode disposed on the first charge storage layer. The first electrode and the first gate electrode are arranged in the second direction.

15 Claims, 31 Drawing Sheets

(51) Int. Cl.
  *G11C 11/18* (2006.01)
  *G11C 11/16* (2006.01)
  *H10B 61/00* (2023.01)
  *H10N 52/00* (2023.01)

(52) U.S. Cl.
  CPC .......... *G11C 11/1675* (2013.01); *G11C 11/18* (2013.01); *H10B 61/00* (2023.02); *H10N 52/00* (2023.02)

(58) Field of Classification Search
  USPC .......................................................... 365/158
  See application file for complete search history.

(56) References Cited

U.S. PATENT DOCUMENTS

| | | | | |
|---|---|---|---|---|
| 10,592,802 | B2* | 3/2020 | Sengupta | G06N 3/088 |
| 10,762,942 | B1* | 9/2020 | Katti | G11C 11/1659 |
| 10,916,284 | B2* | 2/2021 | Le | H01L 43/08 |
| 11,069,390 | B2* | 7/2021 | Hu | H01F 10/3286 |
| 11,152,047 | B2* | 10/2021 | Jung | H01L 43/08 |
| 11,227,990 | B2* | 1/2022 | Shakh | H01L 43/08 |
| 11,250,896 | B2* | 2/2022 | Thirumala | G11C 11/1673 |
| 11,264,564 | B2* | 3/2022 | Ikegawa | H01L 43/02 |
| 11,271,045 | B2* | 3/2022 | Kang | H01L 27/3206 |
| 11,355,696 | B2* | 6/2022 | Chen | H01L 27/228 |
| 11,398,596 | B2* | 7/2022 | Manipatruni | G11C 11/1659 |
| 11,456,100 | B2* | 9/2022 | Lin | H01L 43/08 |
| 11,462,678 | B2* | 10/2022 | O'Brien | H01L 43/10 |
| 2020/0279992 | A1* | 9/2020 | Pham | H01L 27/228 |
| 2020/0313076 | A1* | 10/2020 | Oguz | G11C 11/161 |
| 2021/0234090 | A1* | 7/2021 | Shimon | G11C 11/161 |
| 2021/0296575 | A1* | 9/2021 | Kim | H01L 43/08 |
| 2022/0044103 | A1* | 2/2022 | Nguyen | H01L 43/08 |

OTHER PUBLICATIONS

Shunsuke Fukami et al., Magnetization switching by spin-orbit torque in an antiferromagnet-ferromagnet bilayer system, Nature Mater. 15, 535 541 (2016).

Seung-heon C. Baek et al., Spin currents and spin-orbit torques in ferromagnetic trilayers, Nature Mater. 17, 509, 2018.

Guoqiang Yu et al., Switching of perpendicular magnetization by spin-orbit torques in the absence of external magnetic fields, Nat. Nanotechnol. 9, 548 (2014).

Long You et al., Switching of perpendicularly polarized nanomagnets with spin orbit torque without an external magnetic field by engineering a tilted anisotropy, Proc. Natl. Acad. Sci. U. S. A. 112, 10310 (2015).

W.J. Kong et al., Spin-orbit torque switching in a T-type magnetic configuration with current orthogonal to easy axes, Nat. Commun. 10, 233 (2019).

D. MacNeill et al., Control of spin-orbit torques through crystal symmetry in WTe2/ferromagnet bilayers, Nat. Phys. 13, 300-305 (2017).

Peng Song et al., Coexistence of large conventional and planar spin Hall effect with long spin diffusion length in a low-symmetry semimetal at room temperature, Nat. Mater. 19, 292-298 (2020).

* cited by examiner

MAGNETIC DEVICE WITH GATE ELECTRODE

CROSS-REFERENCE TO RELATED APPLICATIONS

This U.S. non-provisional patent application claims priority under 35 U.S.C. § 119 of Korean Patent Application No. 10-2020-0147207, filed on Nov. 6, 2020, the entire contents of which are hereby incorporated by reference.

BACKGROUND

The present disclosure herein relates to a magnetic device, and more specifically, to a magnetic tunnel junction device with a gate electrode that changes program and erase characteristics of a magnetic device.

A ferromagnetic material refers to a material that is spontaneously magnetized even when no magnetic field is applied from the outside. There is provided a tunnel junction unit cell having a magnetic tunnel junction structure (first ferromagnetic layer/insulation layer/second ferromagnetic layer) in which an insulation layer made of an insulating material is inserted between two ferromagnetic layers made of the ferromagnetic material.

Here, a tunnel magnetoresistive effect occurs in which electrical resistance varies according to a relative magnetization direction between the first and second ferromagnetic layers. This occurs because electrons having an up-spin and a down-spin in the magnetic tunnel junction structure have different degrees of flow through tunneling through the insulating layer. As a result, due to the tunnel magnetoresistive effect, the relative magnetization direction between the first and second ferromagnetic layers can control a current flowing through the tunnel junction unit cell.

Meanwhile, according to the law of action-reaction, which is Newton's third law, if the magnetization direction can control the flow of a current, it is also possible to control the magnetization direction of the ferromagnetic layer by allowing a current to flow through the reaction. When a current flows in a perpendicular (thickness) direction of the magnetic junction unit cell forming the magnetic tunnel junction structure, a current which is spin-polarized by the first magnetic layer (fixed magnetic layer) passes through the second magnetic layer (free magnetic layer) and transfers its spin angular momentum to the magnetization of the free magnetic layer. Torque felt by the magnetization by the transfer of the spin angular momentum is referred to as spin-transfer-torque, and it is possible to reverse or continuously rotate the magnetization of the free magnetic layer using the spin-transfer-torque.

In order to control a magnetization direction using spin-transfer-torque, a spin polarization current should pass through a magnetic material. However, in recent years, a technique for achieving the magnetization reversal of a magnetic body by allowing a heavy metal generating a spin current to be adjacent to the magnetic body, thereby applying a horizontal current, that is, a spin orbit torque (SOT) technique has been proposed.

However, a free layer having perpendicular magnetic anisotropy requires an external magnetic field for deterministic magnetization reversal or switching.

SUMMARY

The present disclosure provides a magnetic device in which a charge storage layer capable of storing charges is disposed adjacent to a free layer of a magnetic tunnel junction, thereby performing field-free switching and electrical control of a switching polarity.

An embodiment of inventive concept provides a magnetic device including a conductive layer extended in a first direction and providing a spin Hall effect on a placement plane defined by the first direction and a second direction, a free layer disposed on the conductive layer, a fixed layer disposed on a portion of the free layer, a tunnel barrier layer disposed between the free layer and the fixed layer, a first electrode disposed on the fixed layer, a first charge storage layer disposed on the free layer so as not to overlap the fixed layer, and a first gate electrode disposed on the first charge storage layer. The first electrode and the first gate electrode are arranged in the second direction.

In an embodiment, the first charge storage layer may be an oxide film, and oxygen ions of the first charge storage layer may generate a lateral modulation of the Rashba effect or an out-of-plane spin orbit torque by a voltage applied to the first gate electrode.

In an embodiment, the first charge storage layer may include fixed charges, and a voltage applied to the first gate electrode may move the fixed charges of the first charge storage layer.

In an embodiment, the first charge storage layer may include trapped charges, and charges may be trapped in the first charge storage layer by a voltage applied to the first gate electrode.

In an embodiment, the magnetic device may further include an auxiliary tunnel barrier layer disposed between the first charge storage layer and the free layer.

In an embodiment, the tunnel barrier layer may be extended to overlap the first charge storage layer.

In an embodiment, the first charge storage layer may include a tunnel insulation layer, a floating conductive layer, and a blocking insulation layer sequentially stacked.

In an embodiment, the first charge storage layer may include a tunnel insulation layer, a charge trapping layer, and a blocking insulation layer sequentially stacked.

In an embodiment, the magnetic device may further include a second charge storage layer disposed on the free layer so as not to overlap the fixed layer and the first charge storage layer, and a second gate electrode disposed on the second charge storage layer, wherein the first gate electrode, the first electrode, and the second gate electrode are sequentially arranged in the second direction.

In an embodiment, the first charge storage layer and the second charge trapping layer may include a tunnel insulation layer, a charge trapping layer, and a blocking insulation layer sequentially stacked.

In an embodiment, the first charge storage layer and the second charge storage layer may include fixed charges.

In an embodiment of the inventive concept, a magnetic device includes a conductive layer extended in a first direction and providing a spin Hall effect on a placement plane defined by the first direction and a second direction, a free layer disposed on the conductive layer, a fixed layer disposed on a portion of the free layer, a tunnel barrier layer disposed between the free layer and the fixed layer, a first electrode disposed on the fixed layer, a first charge storage layer disposed on the free layer so as not to overlap the fixed layer, and a first gate electrode disposed on the first charge storage layer, wherein the first electrode and the first gate electrode are arranged in the second direction. A method for operating the magnetic device includes applying a first program gate voltage to the first gate electrode to accumulate charges in or move the charges to the first charge storage layer, thereby programming the first charge storage layer to a first polarity, applying an in-plane current to the conductive layer to switch the magnetization direction of the free layer, and applying a read voltage to the first electrode to read tunnel resistance of a magnetic tunnel junction by the free layer/tunnel barrier layer/fixed layer.

In an embodiment, the method may further include at least one among applying an erase gate voltage having a sign opposite to the first program gate voltage to the first gate electrode to remove the first polarity program state formed in the first charge storage layer, when the first charge storage layer is in an erase state, applying a second program gate voltage to the first gate electrode to accumulate charges in or move the charges to the first charge storage layer, thereby programming the first charge storage layer to a second polarity, applying an in-plane current I_inplane to the conductive layer to switch the magnetization direction of the free layer, and applying an erase gate voltage having a sign opposite to the second program gate voltage to the first gate electrode to remove the second polarity program state formed in the first charge storage layer.

In an embodiment of the inventive concept, a magnetic device includes a conductive layer extended in a first direction and providing a spin Hall effect on a placement plane defined by the first direction and a second direction, a free layer disposed on the conductive layer, a fixed layer disposed on a portion of the free layer, a tunnel barrier layer disposed between the free layer and the fixed layer, a first electrode disposed on the fixed layer, a first charge storage layer disposed on the free layer so as not to overlap the fixed layer, a first gate electrode disposed on the first charge storage layer, a second charge storage layer disposed on the free layer so as not to overlap the fixed layer and the first charge storage layer, and a second gate electrode disposed on the second charge storage layer, wherein the first gate electrode, the first electrode, and the second gate electrode are sequentially arranged in the second direction. A method for operating the magnetic device includes applying a first program gate voltage to the first gate electrode to accumulate charges in or move the charges to the first charge storage layer, thereby programming the first charge storage layer to a first polarity, applying an in-plane current to the conductive layer to switch the magnetization direction of the free layer, and applying a read voltage to the first electrode to read tunnel resistance of a magnetic tunnel junction by the free layer/tunnel barrier layer/fixed layer.

In an embodiment, the method may further include applying an erase gate voltage having a sign opposite to the first program gate voltage to the first gate electrode to remove the first polarity program state formed in the first charge storage layer.

In an embodiment of the inventive concept, a magnetic device includes a conductive layer extended in a first direction and providing a spin Hall effect on a placement plane defined by the first direction and a second direction, a free layer disposed on the conductive layer, a fixed layer disposed on a portion of the free layer, a tunnel barrier layer disposed between the free layer and the fixed layer, a first electrode disposed on the fixed layer, a first charge storage layer disposed on the free layer so as not to overlap the fixed layer, a first gate electrode disposed on the first charge storage layer, a second charge storage layer disposed on the free layer so as not to overlap the fixed layer and the first charge storage layer, and a second gate electrode disposed on the second charge storage layer, wherein the first gate electrode, the first electrode, and the second gate electrode are sequentially arranged in the second direction. A method for operating the magnetic device includes applying a first program gate voltage to the first gate electrode to accumulate charges in or move the charges to the first charge storage layer, thereby programming the first charge storage layer to a first polarity, applying an in-plane current to the conductive layer to switch the magnetization direction of the free layer, applying an erase gate voltage having a sign opposite to the first program gate voltage to the first gate electrode to remove the first polarity program state formed in the first charge storage layer, applying a first auxiliary program gate voltage to the second gate electrode to accumulate charges in or move the charges to the second charge storage layer, thereby programming the second charge storage layer to a second polarity, applying an in-plane current to the conductive layer to switch the magnetization direction of the free layer, and applying an erase gate voltage having a sign opposite to the first auxiliary program gate voltage to the second gate electrode to remove the second polarity program state formed in the second charge storage layer.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1A:
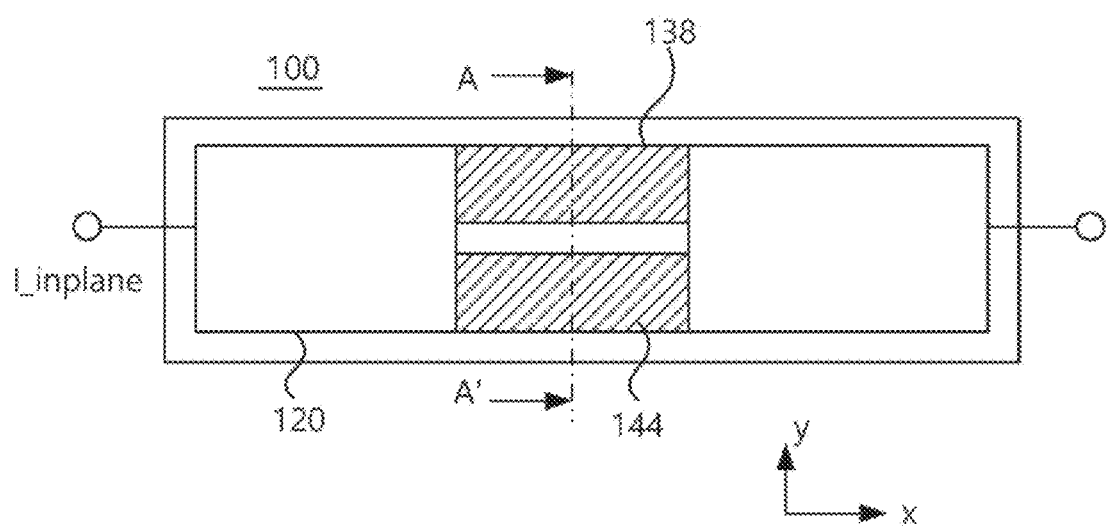
FIG. 1A is a plan view of a magnetic device according to an embodiment of the inventive concept.

Hereinafter, the inventive concept will be described in more detail with reference to the accompanying drawings. Hereinafter, the inventive concept will be described in more detail with reference to preferred embodiments. However, it will be apparent to those skilled in the art that these embodiments are to describe the inventive concept in more detail, and that the inventive concept is not limited or limited by experimental conditions, material types, and the like. The inventive concept is not limited to the embodiments described herein, and may be embodied in other forms. Rather, the embodiments introduced herein are provided to ensure that the disclosed contents may be thorough and complete, and that the spirit of the inventive concept may be sufficiently conveyed to those skilled in the art. In the drawings, elements are exaggerated for clarity. Like reference numerals refer to like elements throughout the specification.

FIG. 1A is a plan view of a magnetic device according to an embodiment of the inventive concept.

Figure 1B:
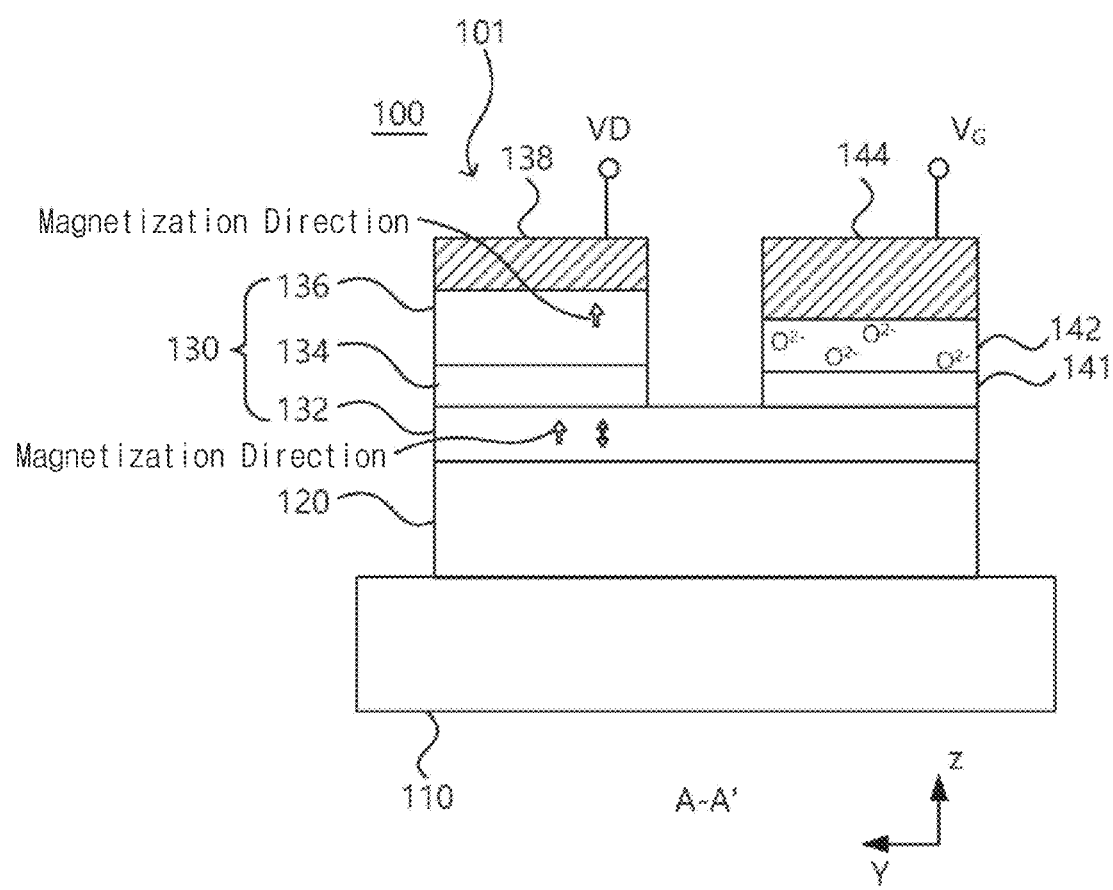
FIG. 1B is a cross-sectional view taken along line A-A' of FIG. 1A.

FIG. 1B is a cross-sectional view taken along line A-A' of FIG. 1A.

Figure 1C:
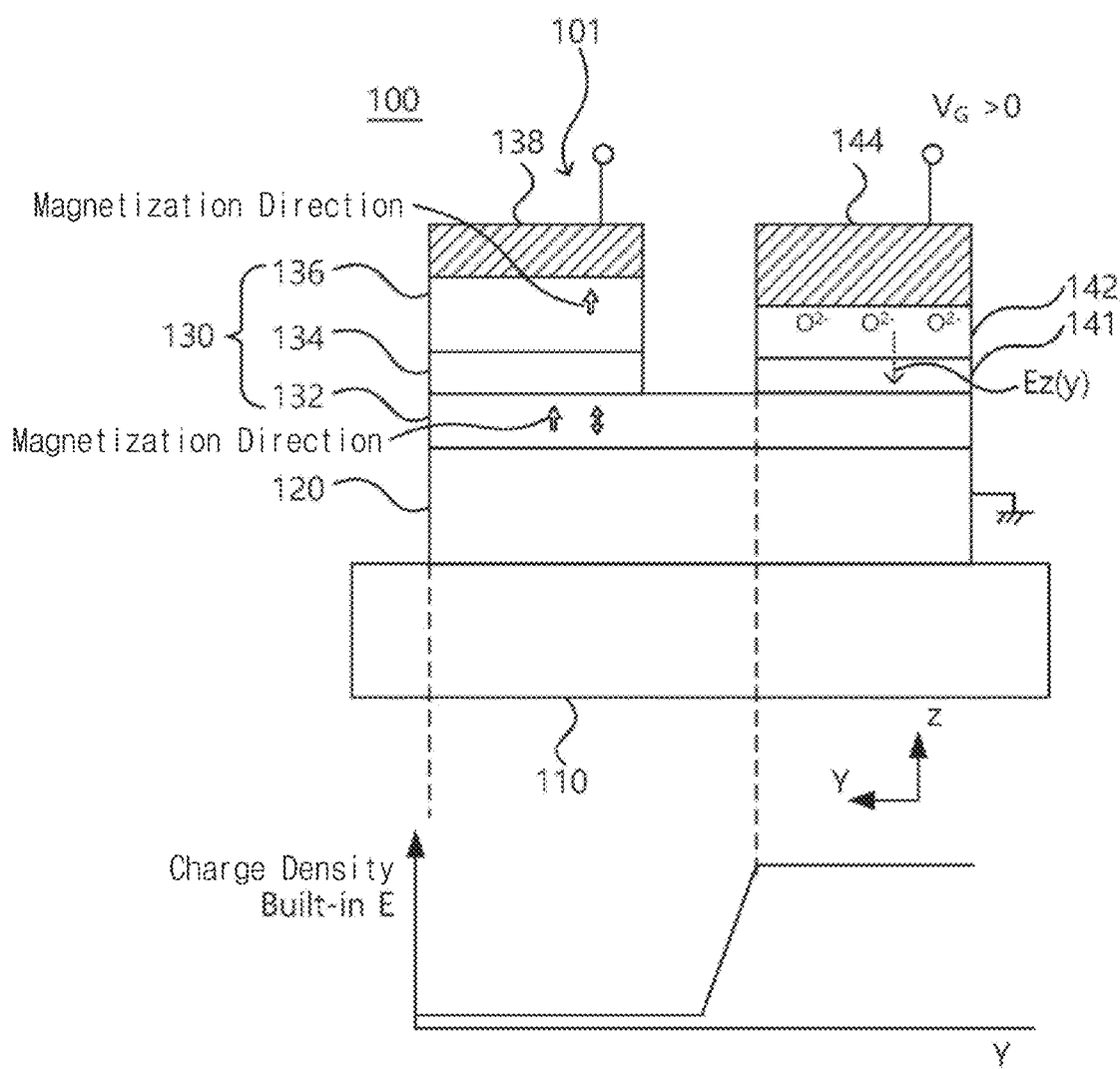
FIG. 1C is a cross-sectional view showing the charge density of a charge storage layer when a gate voltage is applied to a first gate electrode.

FIG. 1C is a cross-sectional view showing the charge density of a charge storage layer when a gate voltage is applied to a first gate electrode.

Figure 1D:
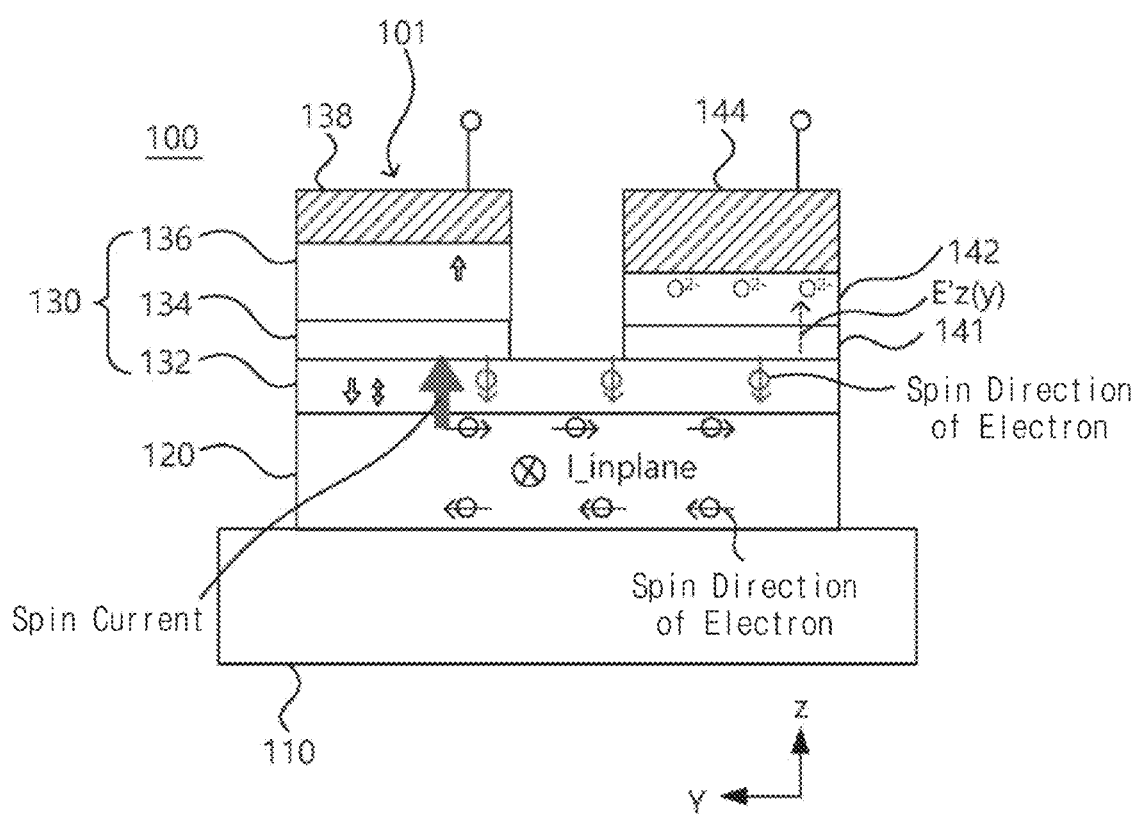
FIG. 1D is a view showing the spin direction and spin current of an electron when an in-plane current is flowing in a conductive layer.

FIG. 1D is a view showing the spin direction and spin current of an electron when an in-plane current is flowing in a conductive layer.

Referring to FIG. 1A to FIG. 1D, a magnetic device 100 includes a conductive layer 120 extended in a first direction (x axis direction) and providing a spin Hall effect on a placement plane (xy plane) defined by the first direction (x axis direction) and a second direction (y axis direction), a free layer 132 disposed on the conductive layer 120, a fixed layer 136 disposed on a portion of the free layer 132, a tunnel barrier layer 134 disposed between the free layer 132 and the fixed layer 136, a first electrode 138 disposed on the fixed layer 136, a first charge storage layer 142 disposed on the free layer 132 so as not to overlap the fixed layer 136, and a first gate electrode 144 disposed on the first charge storage layer 142. The first electrode 138 and the first gate electrode 144 are arranged in the second direction (y axis direction).

The free layer 132 of a magnetic tunnel junction 101 may be switched by a spin orbit torque (SOT) caused by an in-plane current I_inplane, and a tunnel resistance of the magnetic tunnel junction 101 may be read by applying a read voltage to the first electrode 138. The tunnel resistance may vary depending on whether magnetization directions of the free layer 132 and the fixed layer 136 are parallel or anti-parallel. Accordingly, the magnetic tunnel junction may operate as a magnetic memory.

A typical spin orbit torque (SOT) device requires an external magnetic field in a first direction for magnetization switching of the free layer 132 having perpendicular magnetic anisotropy.

However, the inventive concept shares the free layer 132 of the magnetic tunnel junction 101 and a tunnel barrier layer 134, and includes a first charge storage layer 142 and a first gate electrode 144 stacked on the tunnel barrier layer 134. The first charge storage layer 142 may generate a spin current Is having a spin aligned in a z axis direction on an interface of free layer/tunnel barrier layer. A spin current having a spin aligned in the y axis direction and generated by an in-plane current of the conductive layer 120 and a spin current having a spin aligned in the z axis direction on the interface of free layer/tunnel barrier layer may provide field-free switching to the free layer 132.

A substrate 110 may be a silicon substrate. A semiconductor device may be provided on the substrate 110. An interlayer insulation film (not shown) may be disposed on the substrate 110. The magnetic tunnel junction 101 may be disposed on the interlayer insulation film. The magnetic tunnel junction 101 may include a structure of free layer/ tunnel barrier layer/fixed layer.

The conductive layer 120 may be a heavy metal inducing a spin Hall effect or the Rashba effect. The conductive layer 120 may include at least one of Pt, W, or Ta. The conductive layer 120 may be extended in the x axis direction on the placement plane (xy plane). Both ends of the conductive layer 120 may be connected to an external circuit to allow the in-plane current I-inplane to flow. With the help of the first charge storage layer 142, the in-plane current I-inplane may switch the magnetization direction of the free layer 132 without an external magnetic field.

The free layer 132 may be magnetized in a third direction (z axis direction), which is a stacking direction, to have a perpendicular magnetic anisotropy (PMA). The free layer 132 may be a ferromagnetic material including at least one of iron, nickel, cobalt, boron, or silicon. The free layer 132 may be CoFeB.

The tunnel barrier layer 134 is an insulation layer, and operates as a tunnel barrier. The tunnel barrier layer 134 may include at least one of an aluminum oxide, a magnesium oxide, a tantalum oxide, or a zirconium oxide.

The fixed layer 136 may be magnetized in the z axis direction, which is a stacking direction, to have a perpendicular magnetic anisotropy (PMA). The fixed layer 136 may be a ferromagnetic material including at least one of iron, nickel, cobalt, boron, or silicon. The fixed layer 136 may include a magnetic layer and an anti-ferromagnetic layer. In addition, the fixed layer 136 may be an artificial anti-ferromagnetic layer. Specifically, the fixed layer 136 may have an artificial anti-ferromagnetic structure of a three-layered structure of magnetic layer/conductive layer/ magnetic layer, and the anti-ferromagnetic layer may be made of iridium (Jr), platinum (Pt), iron (Fe), manganese (Mn), and an alloy thereof, or oxides of Ni, Co, and Fe, and a material of an alloy thereof. The artificial anti-ferromagnetic structure may be composed of a magnetic layer made of iron (Fe), cobalt (Co), nickel (Ni), boron (B), silicon (Si), zirconium (Zr), platinum (Pt), palladium (Pd), and an alloy thereof and a conductive layer made of ruthenium (Ru), copper (Cu), platinum (Pt), tantalum (Ta), titanium (Ti), tungsten (W), and the like.

The first electrode 138 is disposed on the fixed layer 136, and may operate as an electrode for applying an external voltage VD.

An auxiliary tunnel barrier layer 141 may be disposed between the first charge storage layer 142 and the free layer 132. The auxiliary tunnel barrier layer 141 may be deposited at the same time as the formation of the tunnel barrier layer 134. The auxiliary tunnel barrier layer 141 may have the same structure and material as the tunnel barrier layer 134. The thickness of the auxiliary tunnel barrier layer 141 may be equal to or less than the thickness of the tunnel barrier layer 134.

The thickness of the charge storage layer 142 may be greater than the thickness of the tunnel barrier layer 134 in order to store sufficient charges. The first charge storage layer 142 may have a single-layered structure, or a multi-layered structure.

The first charge storage layer 142 is an oxide film, and oxygen ions of the first charge storage layer 142 may generate a lateral modulation of the Rashba effect or an out-of-plane spin orbit torque by a voltage applied to the first gate electrode 144. For example, the first charge storage layer 142 may be a titanium oxide film ($TiO_2$) or a zirconium oxide film $ZrO_2$. For example, when the first charge storage layer 142 is a titanium oxide film ($TiO_2$), oxygen ions ($O^{2-}$) may have a random spatial distribution in a deposition state. When a positive voltage ($V_G>0$) is applied to the first gate electrode 144, the oxygen ions ($O^{2-}$) may be moved by an electric field Ez. Accordingly, a charge density of the first charge storage layer 142 may be moved to an interface between the first charge storage layer 142 and the first gate electrode 144 along the third direction (z axis direction). After the voltage is removed from the first gate electrode 144, the charge density may provide asymmetry of a built-in electric field in the y axis direction with respect to the free layer 132.

The first charge storage layer 142 includes fixed charges, and a voltage $V_G$ applied to the first gate electrode 144 may move the fixed charges of the first charge storage layer 142.

Alternatively, the first charge storage layer 142 includes trapped charges, and charges may be trapped in the first charge storage layer 142 by the voltage $V_G$ applied to the first gate electrode 144. The first charge storage layer 142 provides a trap site capable of trapping charges, and may include a silicon nitride film or an aluminum oxide film.

When the in-plane current I_inplane is flowing in a positive x axis direction in the conductive layer 120, the spin current Is may flow in the z axis direction by electrons polarized in a negative y axis direction on the interface of the free layer 132 and the conductive layer 120. An asymmetric built-in electric field E'z(y) may provide the spin current Is polarized in the z axis direction (perpendicular direction) by the Rashba effect.

A spin Hall effect SHE is a bulk origin effect in spin-orbit coupling of the conductive layer 120, but the Rashba effect may occur in a broken inversion symmetry at an interface of a heterostructure of the conductive layer 120/free layer 132/tunnel barrier layer 134.

When the first gate voltage ($V_G>0$) is applied, additional lateral symmetry breaking occurs along the y axis direction. When the in-plane current I_inplane flows along the x axis direction, a symmetry analysis shows that lateral symmetry breaking along the y axis direction may generate an additional SOT in m×z and m×(m×z) directions. Here, m and z are unit vectors along the magnetization and thickness directions of the free layer 132, respectively. An out-of-plane SOT or a z-SOT may switch perpendicular magnetization of the free layer 132 without an external magnetic field, and the z-SOT may reduce a switching current greatly. Electric-field-induced lateral symmetry breaking may generate the out-of-plane SOT or the z-SOT.

The first gate electrode 144 may be spaced apart from the first electrode 138 and arranged in the second direction (y axis direction). The first gate electrode 144 and the first charge storage layer 142 may provide charge density or asymmetry of a built-in electric field in the second direction (y-axis direction). The asymmetry may induce field-free switching.

Figure 2:
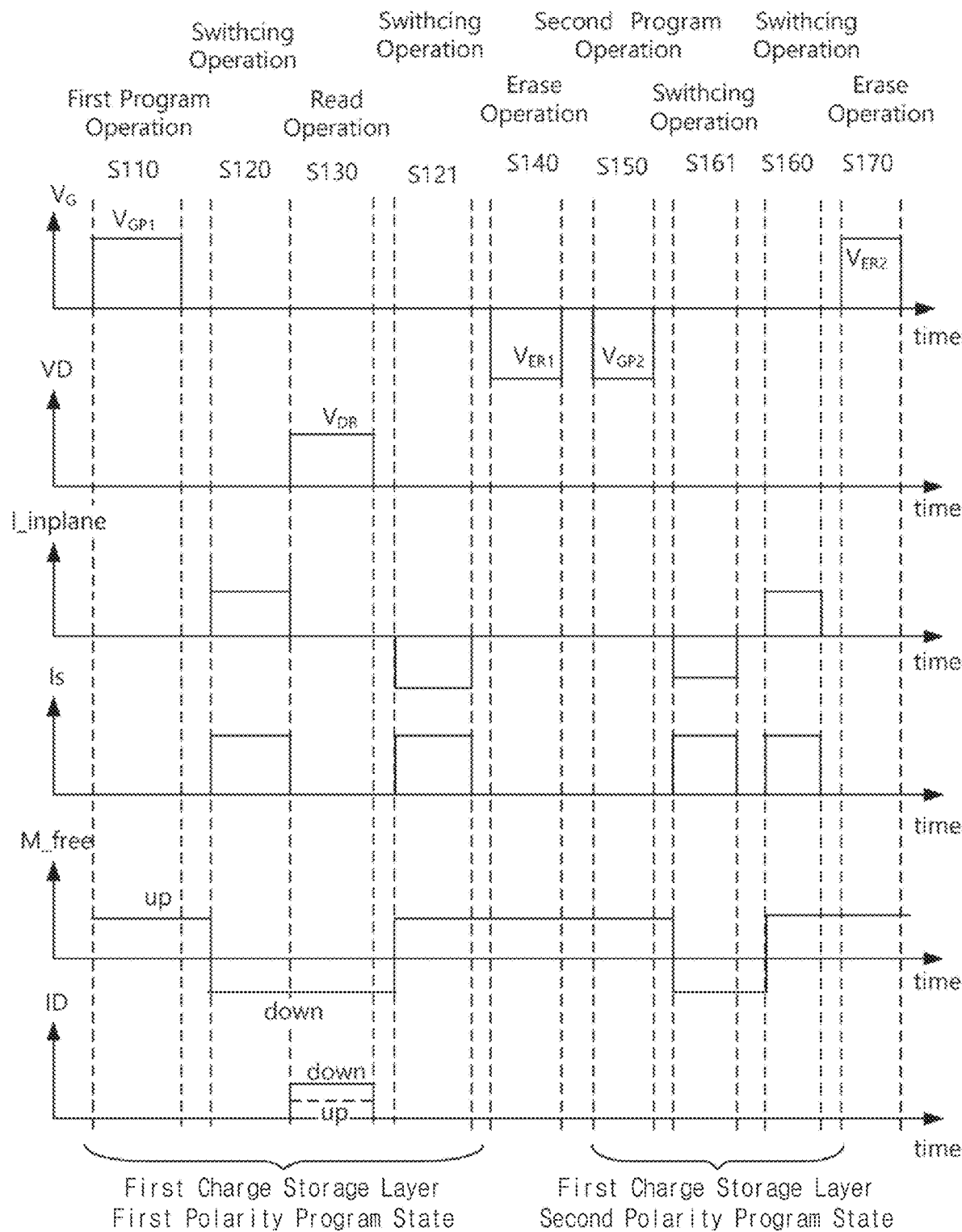
FIG. 2 is a timing diagram showing a method for operating a magnetic device according to an embodiment of the inventive concept.

FIG. 2 is a timing diagram showing a method for operating a magnetic device according to an embodiment of the inventive concept.

Referring to FIG. 1A to FIG. 1D and FIG. 2, S110 applying a first program gate voltage $V_{GP1}$ to the first gate electrode 144 to accumulate charges in or move the charges to the first charge storage layer 142, thereby programming the first charge storage layer to a first polarity, S120 applying the in-plane current I_inplane to the conductive layer 120 to switch magnetization direction of the free layer 132, and S130 applying a read voltage $V_{DR}$ to the first electrode 138 to read tunnel resistance of the magnetic tunnel junction 101 by the free layer 132/tunnel barrier layer 134/fixed layer 136 are included.

In Step S110 of accumulating charges in or moving the charges to the first charge storage layer 142, thereby programming the first charge storage layer to a first polarity, the conductive layer 120 is grounded, and the first program gate voltage $V_{GP1}$ is applied to the first gate electrode 144. Accordingly, charges may accumulate in the first charge storage layer 142 or ions may move thereto to generate a built-in electric field.

When in a first polarity program state of the first charge storage layer 142, in Step S120 of applying the in-plane current I_inplane to the conductive layer 120 to switch the magnetization direction of the free layer 132, the in-plane current I_inplane may be applied in the form of a pulse in the positive x axis direction. The first gate electrode 144 and the first electrode 138 may be in a floating state. The in-plane current I_inplane in the positive x axis direction and the built-in electric field may perform field-free switching on a magnetization direction M_free of a free layer aligned in a positive z axis direction ("up" state) to a negative z axis direction ("down" state).

When in the first polarity program state of the first charge storage layer 142, in Step S130 of applying the read voltage $V_{DR}$ to the first electrode 138 to read tunnel resistance of a magnetic tunnel junction by free layer/tunnel barrier layer/fixed layer, the tunnel resistance may be detected by detecting a current ID flowing in the first electrode 138. The first gate electrode may be in a floating state.

In the first polarity program state of the first charge storage layer 142, when the in-plane current I_inplane is applied in the form of a pulse in a negative x axis direction, the in-plane current I_inplane in the negative x axis direction and the built-in electric field may perform field-free switching on the magnetization direction M_free of a free layer aligned in the negative z axis direction ("down" state) to the positive z axis direction ("up" state) S121.

A step S140 of applying an erase gate voltage $V_{ER1}$ having a sign opposite to the first program gate voltage $V_{GP1}$ to the first gate electrode 144 to remove the first polarity program state formed in the first charge storage layer 142 may remove charges stored in the first charge storage layer 142 or move the charges in an opposite direction. When the first charge storage layer 142 is in an erased state by the erase gate voltage, field-free switching does not occur. For field-free switching, a programming step is required again.

When the first charge storage layer 142 is in an erased state, S150 applying a second program gate voltage $V_{GP2}$ to the first gate electrode 144 to accumulate charges in or move the charges to the first charge storage layer 142, thereby programming the first charge storage layer to a second polarity, S161 applying the in-plane current I_inplane to the conductive layer 120 to switch magnetization direction of the free layer 132, and S130 applying the read voltage $V_{DR}$ to the first electrode 138 to read tunnel resistance of the magnetic tunnel junction 101 by the free layer 132/tunnel barrier layer 134/fixed layer 136 may be included. The second program gate voltage $V_{GP2}$ may be a pulse having a polarity opposite to that of the first program gate voltage $V_{GP1}$.

In Step S150 of accumulating charges in or moving the charges to the first charge storage layer 142, thereby programming the first charge storage layer to a second polarity, the conductive layer 120 is grounded, and the second program gate voltage $V_{GP2}$ is applied to the first gate electrode 144. Accordingly, charges may accumulate in the first charge storage layer 142 or ions may move thereto to generate a built-in electric field.

When in a second polarity program state of the first charge storage layer 142, in Step S161 of applying the in-plane current I_inplane to the conductive layer 120 to switch the magnetization direction of the free layer 132, the in-plane current I_inplane may be applied in the form of a pulse in the negative x axis direction. The first gate electrode 144 and the first electrode 138 may be in a floating state. The in-plane current I_inplane in the negative x axis direction and the built-in electric field may perform field-free switching on the magnetization direction M_free of a free layer aligned in a positive z axis direction ("up" state) to a negative z axis direction ("down" state).

When in the second polarity program state of the first charge storage layer 142, in Step S130 of applying the read voltage $V_{DR}$ to the first electrode 138 to read tunnel resistance of a magnetic tunnel junction by free layer/tunnel barrier layer/fixed layer, the tunnel resistance may be detected by detecting the current ID flowing in the first electrode 138. The first gate electrode may be in a floating state.

In the second polarity program state of the first charge storage layer 142, when the in-plane current I_inplane is applied in the form of a pulse in the positive x axis direction, the in-plane current I_inplane in the positive x axis direction and the built-in electric field may perform field-free switching on the magnetization direction M_free of a free layer aligned in the negative z axis direction ("down" state) to the positive z axis direction ("up" state) S160.

A step S170 of applying an erase gate voltage $V_{ER2}$ having a sign opposite to the second program gate voltage $V_{GP2}$ to the first gate electrode 144 to remove the second polarity program state formed in the first charge storage layer 142 may remove charges stored in the first charge storage layer 142 or move the charges in an opposite direction. When the first charge storage layer 142 is in an erased state by the erase gate voltage, field-free switching does not occur. For field-free switching, a programming step is required again. The first polarity program state and the second polarity program state may have polarities opposite to each other, which are switched by an in-plane current.

Figure 3:
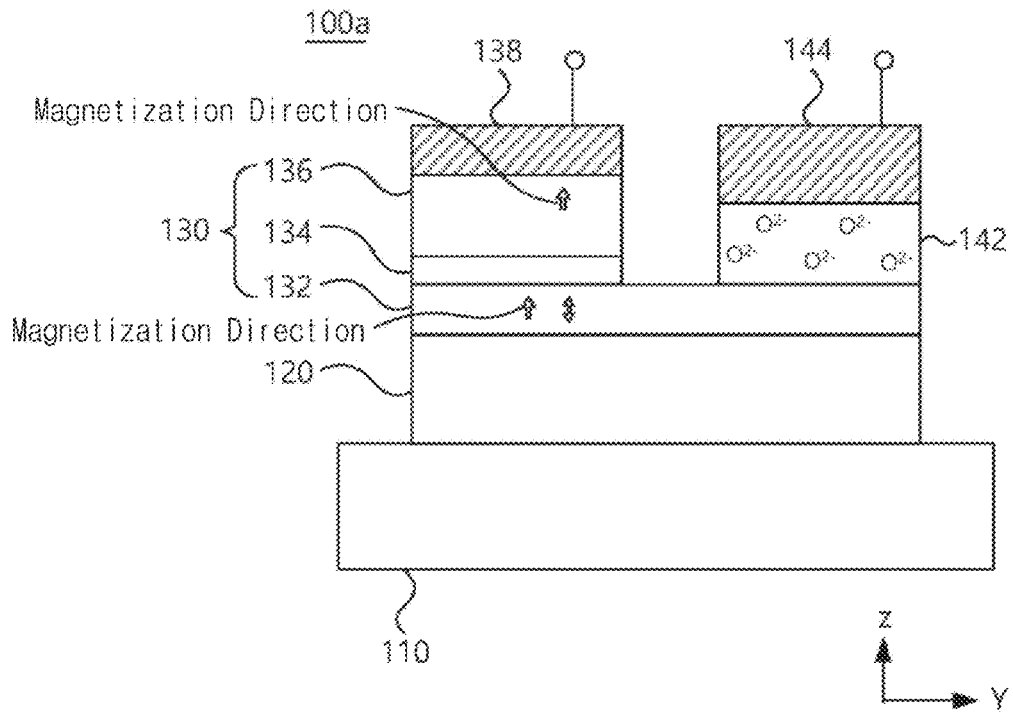
FIG. 3 shows a magnetic device according to an embodiment of the inventive concept.

FIG. 3 shows a magnetic device according to an embodiment of the inventive concept.

Referring to FIG. 3, a magnetic device 100a includes a conductive layer 120 extended in a first direction (x axis direction) and providing a spin Hall effect on a placement plane (xy plane) defined by the first direction (x axis direction) and a second direction (y axis direction), a free layer 132 disposed on the conductive layer 120, a fixed layer 136 disposed on a portion of the free layer 132, a tunnel barrier layer 134 disposed between the free layer 132 and the fixed layer 136, a first electrode 138 disposed on the fixed layer 136, a first charge storage layer 142 disposed on the free layer 132 so as not to overlap the fixed layer 136, and a first gate electrode 144 disposed on the first charge storage layer 142. The first electrode 138 and the first gate electrode 144 are arranged in the second direction (y axis direction).

There may not be an auxiliary tunnel barrier layer between the charge storage layer 142 and the free layer 132. The thickness of the charge storage layer 142 may be sufficiently greater than the thickness of the tunnel barrier layer 134. The charge storage layer 142 is provided with fixed charges, and the fixed charges may move to an interface in the charge storage layer by a program gate electrode applied to the first gate electrode.

Alternatively, the charge storage layer 142 is provided with a trap site, and the trap site may accumulate trapped charges in the charge storage layer by a program gate electrode applied to the first gate electrode.

Figure 4:
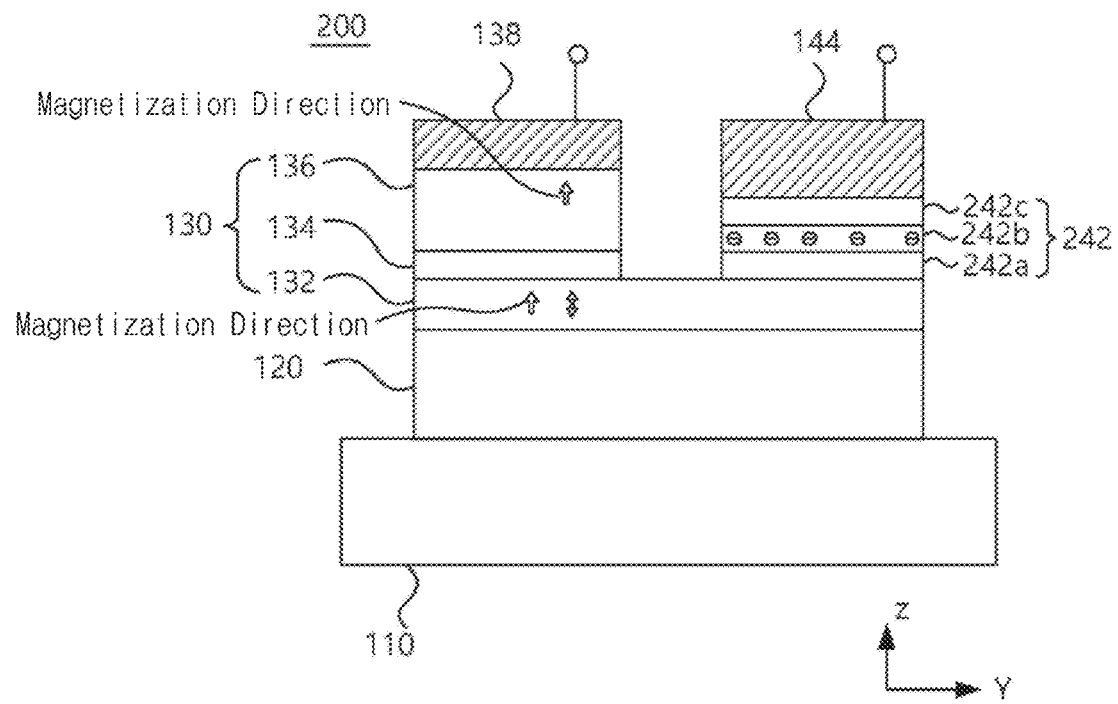
FIG. 4 is shows a magnetic device according to an embodiment of the inventive concept.

FIG. 4 is shows a magnetic device according to an embodiment of the inventive concept.

Referring to FIG. 4, a magnetic device 200 includes a conductive layer 120 extended in a first direction (x axis direction) and providing a spin Hall effect on a placement plane (xy plane) defined by the first direction (x axis direction) and a second direction (y axis direction), a free layer 132 disposed on the conductive layer 120, a fixed layer 136 disposed on a portion of the free layer 132, a tunnel barrier layer 134 disposed between the free layer 132 and the fixed layer 136, a first electrode 138 disposed on the fixed layer 136, a first charge storage layer 242 disposed on the free layer 132 so as not to overlap the fixed layer 136, and a first gate electrode 144 disposed on the first charge storage layer 242. The first electrode 138 and the first gate electrode 144 are arranged in the second direction (y axis direction).

The first charge storage layer 242 may include a tunnel insulation layer 242a, a floating conductive layer 242b, and a blocking insulation layer 242c sequentially stacked. The floating conductive layer 242b may be a metal or heavily doped silicon. The floating conductive layer 242b may perform an operation similar to that of a charge storage layer of a floating gate flash memory. The thickness of the blocking insulation layer 242c may be greater than the thickness of the tunnel insulation layer 242a. The tunnel insulation layer 242a and the blocking insulation layer 242c may be silicon oxide films.

According to a modified embodiment of the inventive concept, the first charge storage layer 242 may include the tunnel insulation layer 242a, a charge trapping layer (now shown), and the blocking insulation layer 242c. The charge trapping layer may perform an operation similar to that of a charge trapping layer of a charge trap flash memory. A band gap of the charge trapping layer may be smaller than a band gap of a first tunnel insulation layer and a band gap of a second tunnel insulation layer. The charge trapping layer may be a silicon nitride film or an aluminum oxide film.

Figure 5:
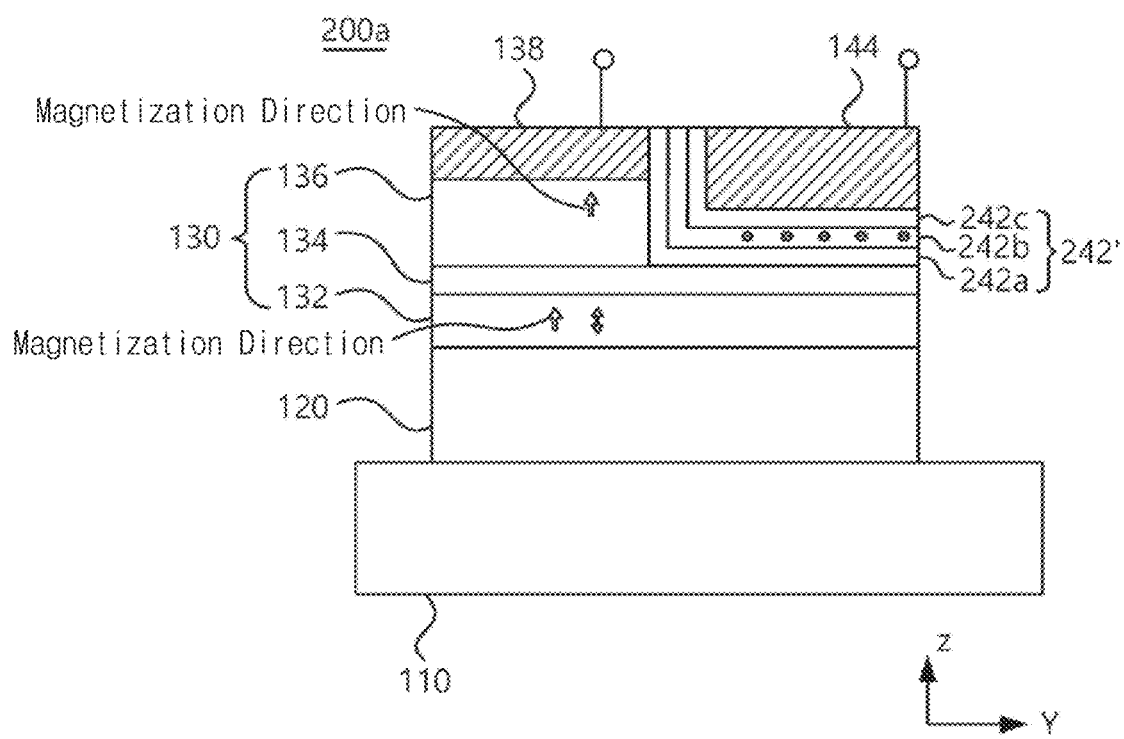
FIG. 5 is shows a magnetic device according to an embodiment of the inventive concept.

FIG. 5 is shows a magnetic device according to an embodiment of the inventive concept.

Referring to FIG. 5, a magnetic device 200a includes a conductive layer 120 extended in a first direction (x axis direction) and providing a spin Hall effect on a placement plane (xy plane) defined by the first direction (x axis direction) and a second direction (y axis direction), a free layer 132 disposed on the conductive layer 120, a fixed layer 136 disposed on a portion of the free layer 132, a tunnel barrier layer 134 disposed between the free layer 132 and the fixed layer 136, a first electrode 138 disposed on the fixed layer 136, a first charge storage layer 242' disposed on the free layer 132 so as not to overlap the fixed layer 136, and a first gate electrode 144 disposed on the first charge storage layer 242'. The first electrode 138 and the first gate electrode 144 are arranged in the second direction (y axis direction).

The first charge storage layer 242' may be extended along a sidewall of the fixed layer 136. The first charge storage layer 242' may include the tunnel insulation layer 242a, the floating conductive layer 242b, and the blocking insulation layer 242c sequentially stacked. The floating conductive layer 242b may be a metal or heavily doped silicon. The floating conductive layer 242b may perform an operation similar to that of a charge storage layer of a floating gate flash memory. The thickness of the blocking insulation layer 242c may be greater than the thickness of the tunnel insulation layer 242a. The tunnel insulation layer 242a and the blocking insulation layer 242c may be silicon oxide films.

According to a modified embodiment of the inventive concept, the first charge storage layer 242' may include the tunnel insulation layer 242a, a charge trapping layer (now shown), and the blocking insulation layer 242c. The charge trapping layer may perform an operation similar to that of a charge trapping layer of a charge trap flash memory. A band gap of the charge trapping layer may be smaller than a band gap of the tunnel insulation layer and a band gap of the blocking insulation layer. The charge trapping layer may be a silicon nitride film or an aluminum oxide film.

Figure 6A:
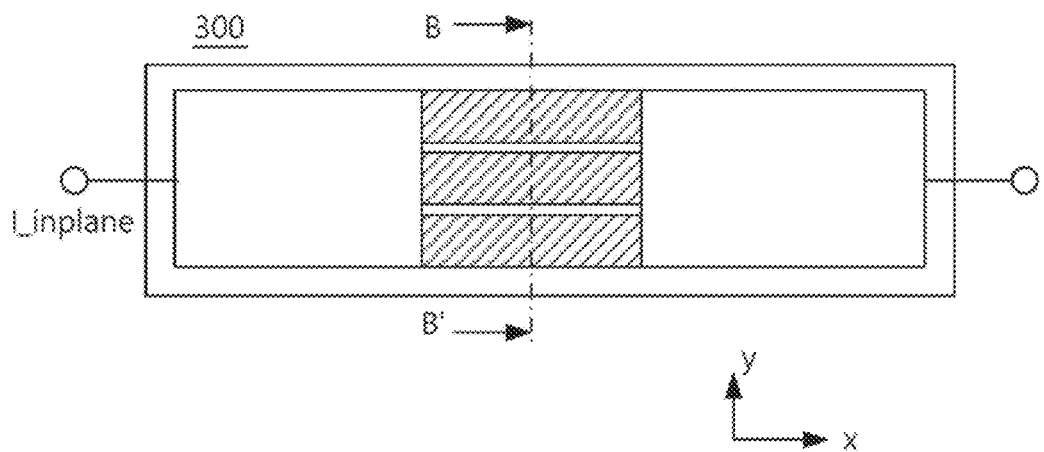
FIG. 6A is a plan view showing a magnetic device according to an embodiment of the inventive concept.

FIG. 6A is a plan view showing a magnetic device according to an embodiment of the inventive concept.

Figure 6B:
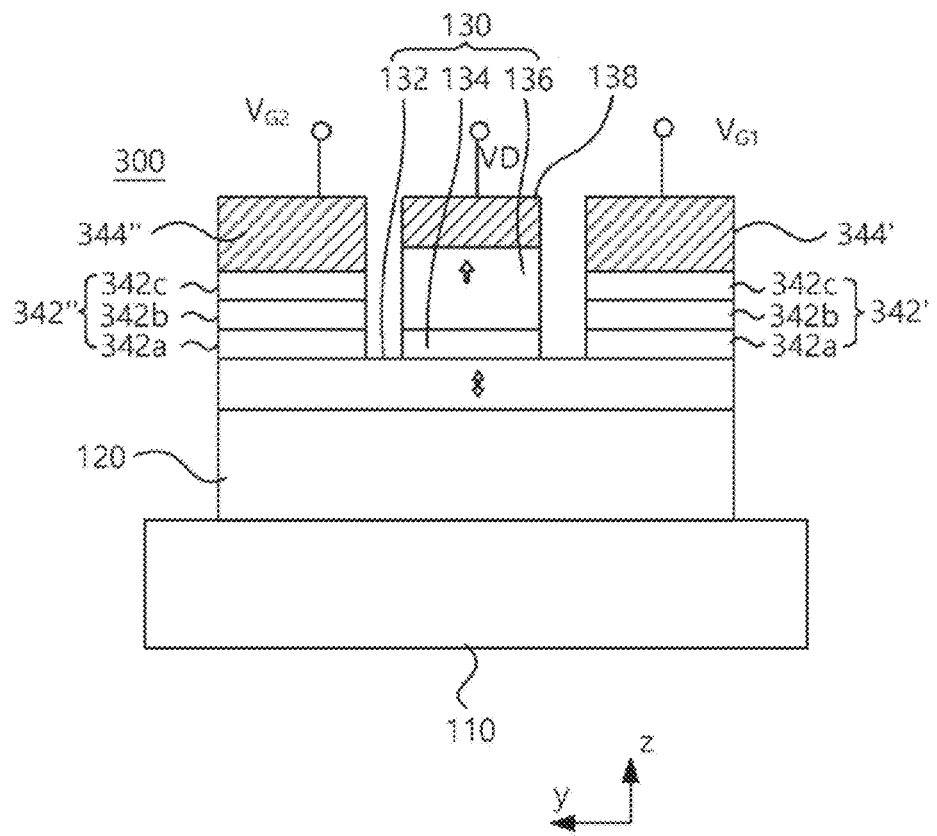
FIG. 6B is a cross-sectional view taken along line B-B' of FIG. 6A.

FIG. 6B is a cross-sectional view taken along line B-B' of FIG. 6A.

Figure 6C:
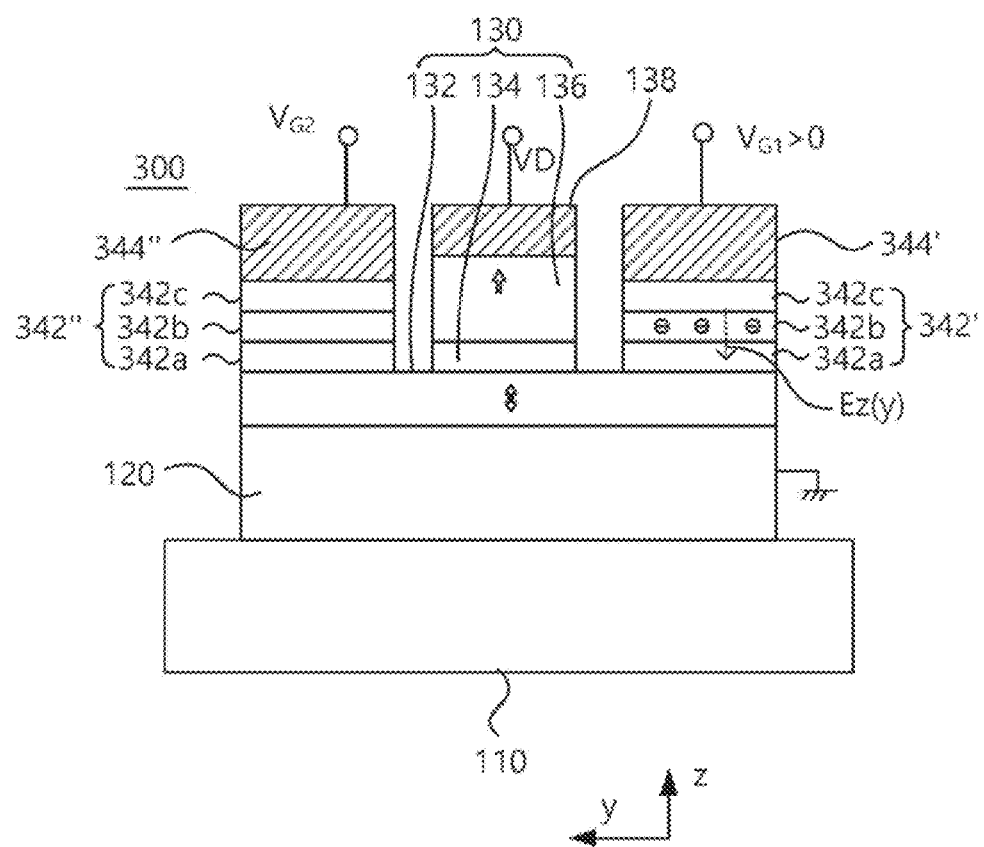
FIG. 6C is a cross-sectional view showing the charge density of a charge storage layer when a gate voltage is applied to a first gate electrode.

FIG. 6C is a cross-sectional view showing the charge density of a charge storage layer when a gate voltage is applied to a first gate electrode.

Figure 6D:
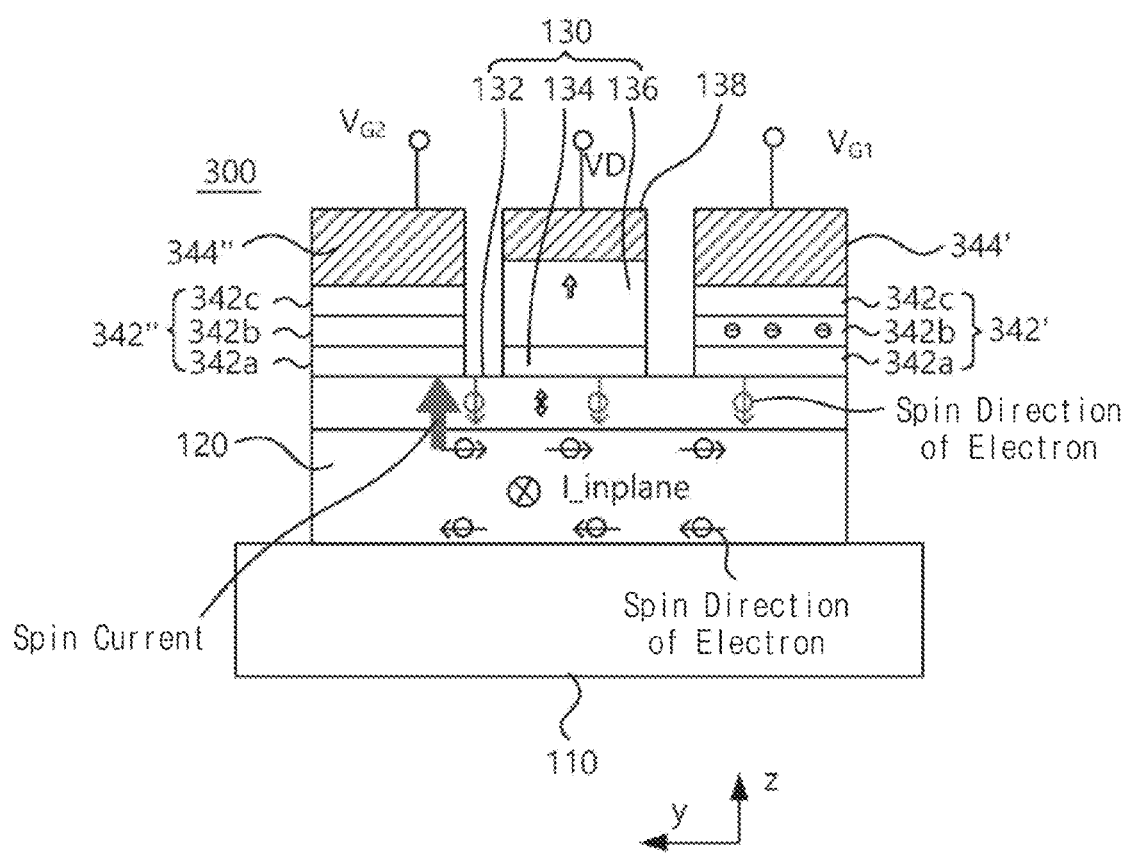
FIG. 6D is a view showing the spin direction and spin current of an electron when an in-plane current is flowing in a conductive layer.

FIG. 6D is a view showing the spin direction and spin current of an electron when an in-plane current is flowing in a conductive layer.

Referring to FIG. 6A to FIG. 6D, a magnetic device 300 includes a conductive layer 120 extended in a first direction (x axis direction) and providing a spin Hall effect on a placement plane defined by the first direction (x axis direction) and a second direction (y axis direction), a free layer 132 disposed on the conductive layer 120, a fixed layer 136 disposed on a portion of the free layer 132, a tunnel barrier layer 134 disposed between the free layer 132 and the fixed layer 136, a first electrode 138 disposed on the fixed layer 136, a first charge storage layer 342' disposed on the free layer 132 so as not to overlap the fixed layer 136, a first gate electrode 344' disposed on the first charge storage layer 342', a second charge storage layer 342" disposed on the free layer 132 so as not to overlap the fixed layer 136 and the first charge storage layer 342', and a second gate electrode 344" disposed on the second charge storage layer 342", wherein the first gate electrode 344', the first electrode 138, and the second gate electrode 344" are sequentially arranged in the second direction (y axis direction).

A voltage $V_{G1}$ applied to the first gate electrode 344' may accumulate charges in or move the charges to the first charge storage layer 342', thereby converting the free layer into a state in which field-free switching is possible.

A voltage $V_{G2}$ applied to the first gate electrode 344' may accumulate charges in or move the charges to the first charge storage layer 342', thereby converting the free layer into a state in which field-free switching is possible.

The first charge storage layer 342' and the second charge storage layer 342" may have the same structure. The thickness of the first charge storage layer 342' may be greater than the thickness of the tunnel barrier layer. Each of the first charge storage layer 342' and the second charge storage layer 342" may have a single-layered structure or a multi-layered structure. The first charge storage layer 342' is an oxide film, and oxygen ions of the first charge storage layer 342' may generate a lateral modulation of the Rashba effect or an out-of-plane spin orbit torque by a voltage applied to the first gate electrode. The first charge storage layer 342' may be a titanium oxide film ($TiO_2$) or a zirconium oxide film ($ZrO_2$). The first charge storage layer 342' includes fixed charges, and the voltage applied to the first gate electrode 344' may move the fixed charges of the first charge storage layer 342'. Alternatively, the first charge storage layer 342' includes trapped charges, and charges may be trapped in the first charge storage layer 342' by the voltage applied to the first gate electrode 344'.

The first charge storage layer 342' may include a tunnel insulation layer 342a, a floating conductive layer 342b, and a blocking insulation layer 342c sequentially stacked. The floating conductive layer 342b may be a metal or heavily doped silicon. The floating conductive layer 342b may perform an operation similar to that of a charge storage layer of a floating gate flash memory.

The first charge storage layer 342' may include the tunnel insulation layer 342a, a charge trapping layer (not shown), and the blocking insulation layer 342c sequentially stacked. The charge trapping layer may perform an operation similar to that of a charge trapping layer of a charge trap flash memory. A band gap of the charge trapping layer may be smaller than a band gap of the tunnel insulation layer 342a and a band gap of the blocking insulation layer 342c.

Figure 7:
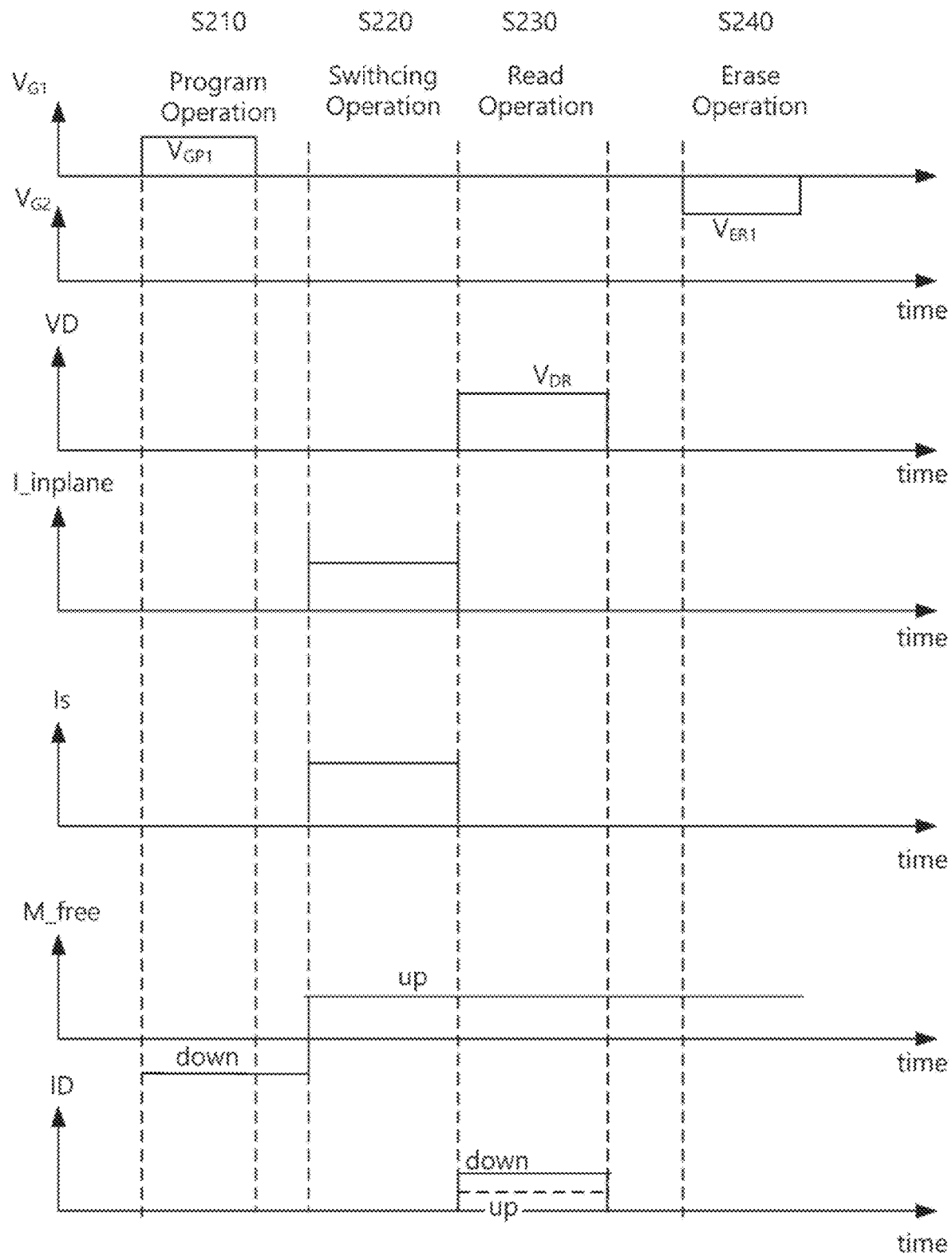
FIG. 7 to FIG. 9 are timing diagrams showing a method for operating a magnetic device according to an embodiment of the inventive concept.
Figure 8:
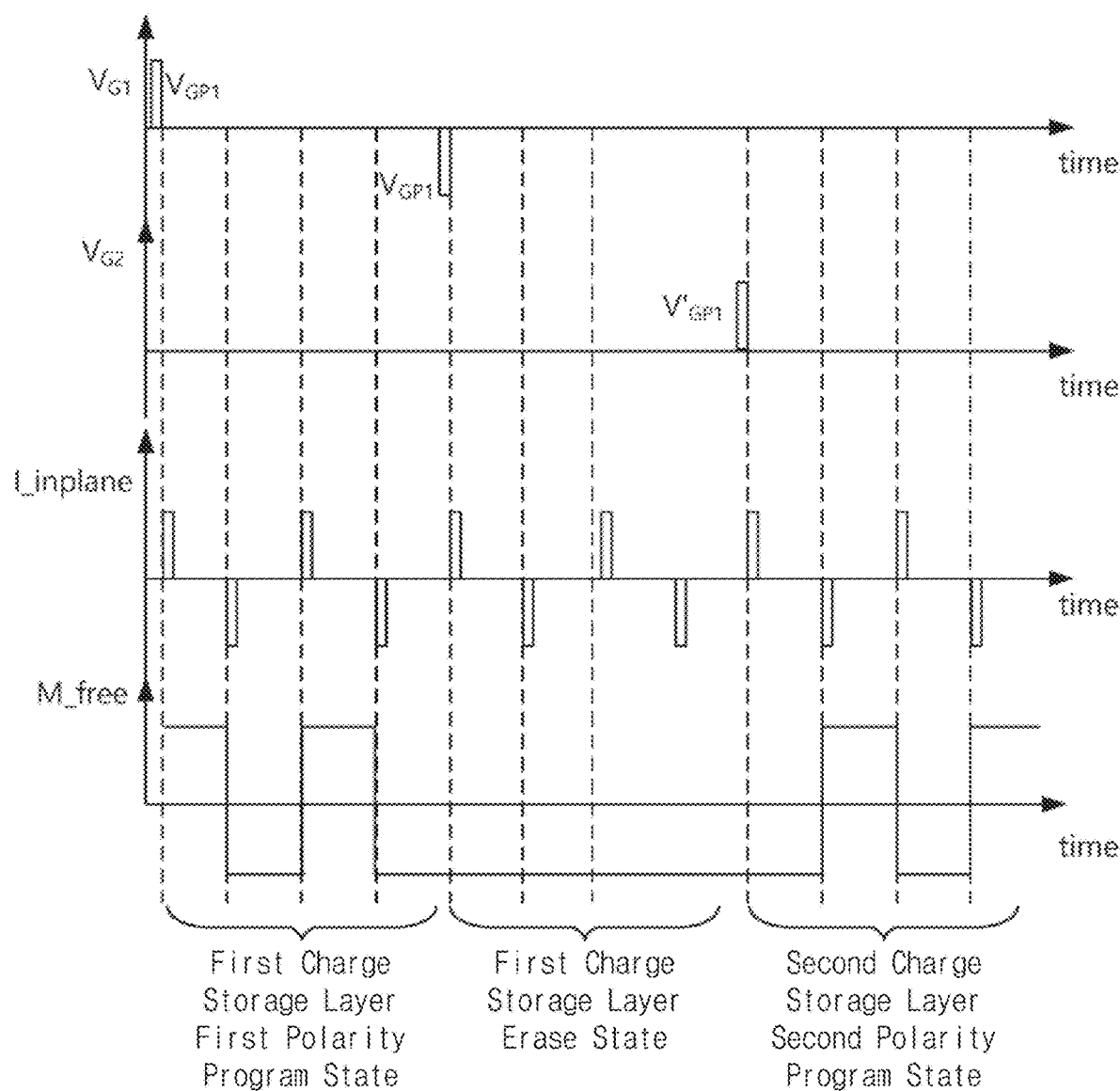
Figure 9:
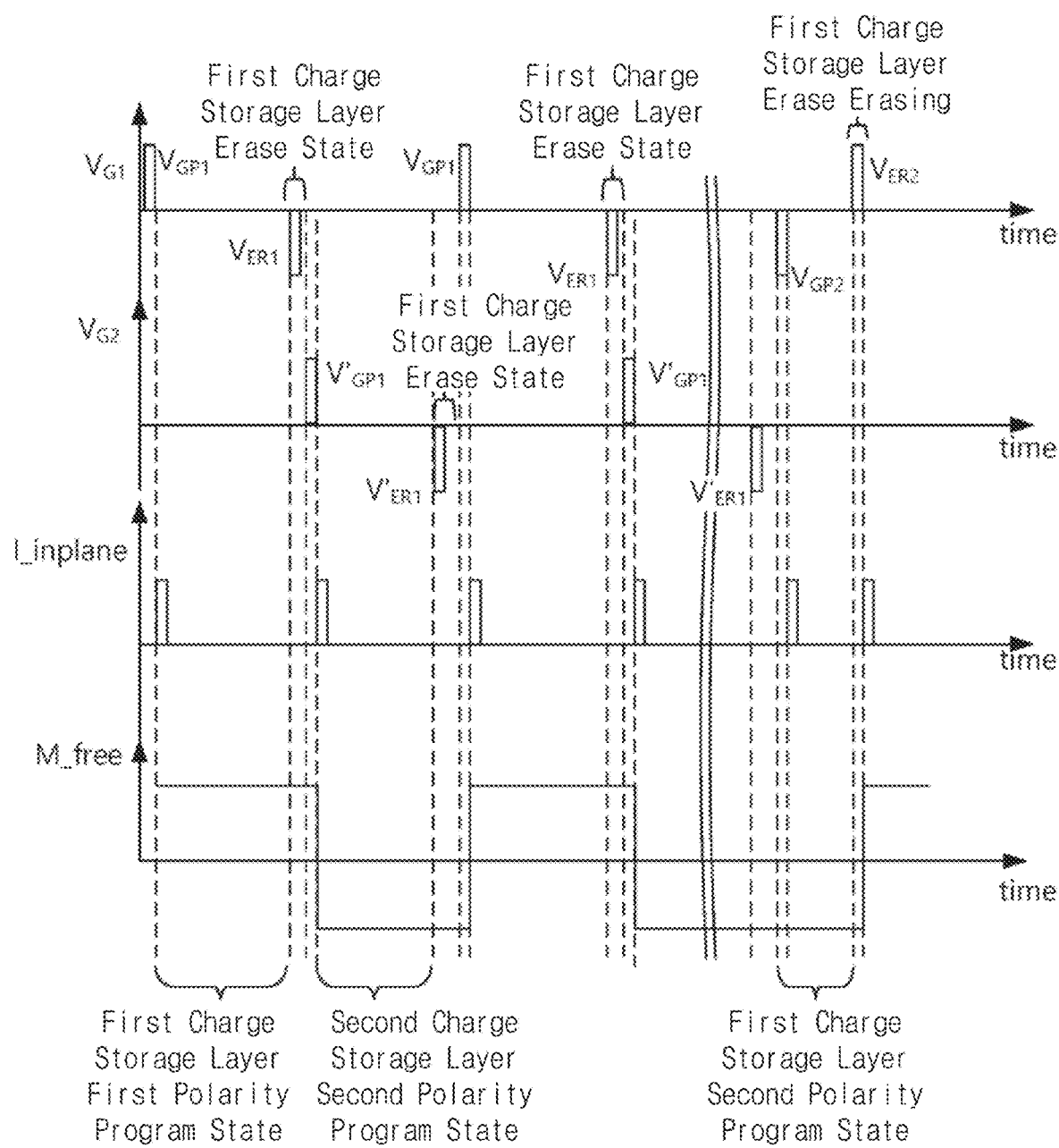

FIG. 7 to FIG. 9 are timing diagrams showing a method for operating a magnetic device according to an embodiment of the inventive concept.

Referring to FIG. 5A to FIG. 5D, FIG. 7, and FIG. 8, S210 applying the first program gate voltage $V_{GP1}$ to the first gate electrode 344' to accumulate charges in or move the charges to the first charge storage layer 342', thereby programming the first charge storage layer 342' to a first polarity, S220 applying the in-plane current I_inplane to the conductive layer 120 to switch the magnetization direction M_free of the free layer 132, and S230 applying the read voltage $V_{DR}$ to the first electrode 138 to read tunnel resistance of a magnetic tunnel junction by free layer/tunnel barrier layer/fixed layer are included.

In Step S210 of accumulating charges in or moving the charges to the first charge storage layer 342', thereby programming the first charge storage layer 342' to a first polarity, the conductive layer 120 is grounded, and the first program gate voltage $V_{GP1}$ is applied to the first gate electrode 344'. Accordingly, charges may accumulate in the first charge storage layer 342' or ions may move thereto to generate a built-in electric field.

When in a first polarity program state of the first charge storage layer 342', in Step S220 of applying the in-plane current I_inplane to the conductive layer 120 to switch the magnetization direction of the free layer 132, the in-plane current I_inplane may be applied in the form of a pulse in the positive x axis direction. The first gate electrodes 344' and 344" and the first electrode 138 may be in a floating state. The in-plane current I_inplane in the positive x axis direction and the built-in electric field may perform field-free switching on the magnetization direction M_free of a free layer aligned in the positive z axis direction ("up" state) to the negative z axis direction ("down" state).

In the first polarity program state of the first charge storage layer 342', when the in-plane current I_inplane is applied in the form of a pulse in the negative x axis direction, the in-plane current I_inplane in the negative x axis direction and the built-in electric field may perform field-free switching on the magnetization direction of a free layer aligned in the positive z axis direction ("up" state) to the negative z axis direction ("down" state).

When in the first polarity program state of the first charge storage layer 342', in Step S230 of applying the read voltage VDR to the first electrode 138 to read tunnel resistance of a magnetic tunnel junction by free layer/tunnel barrier layer/fixed layer, the tunnel resistance may be detected by detecting the current ID flowing in the first electrode 138.

The step S240 of applying the erase gate voltage $V_{ER1}$ having a sign opposite to the first program gate voltage $V_{GP1}$ to the first gate electrode 344' to remove the program state formed in the first charge storage layer 342' may remove charges stored in the first charge storage layer 342' or move the charges in an opposite direction. When the first charge storage layer 342' is in an erased state by the erase gate voltage, field-free switching does not occur. For field-free switching, a programming step is required again.

In Step of accumulating charges in or moving the charges to the second charge storage layer 342", thereby programming to a second polarity, the conductive layer 120 is grounded, and a first auxiliary program gate voltage $V'_{GP1}$ is applied to the second gate electrode 344". Accordingly, charges may accumulate in the second charge storage layer 342" or ions may move thereto to generate a built-in electric field.

When in a second polarity program state of the second charge storage layer 342", in Step of applying the in-plane current I_inplane to the conductive layer 120 to switch the magnetization direction of the free layer 132, the in-plane current I_inplane may be applied in the form of a pulse in the positive x axis direction. The second gate electrode a second electrode may be in a floating state. The in-plane current I_inplane in the positive x axis direction and the built-in electric field may perform field-free switching on the magnetization direction of a free layer aligned in the positive z axis direction ("up" state) to the negative z axis direction ("down" state).

In the second polarity program state of the second charge storage layer 342", when the in-plane current I_inplane is applied in the form of a pulse in the negative x axis direction, the in-plane current I_inplane in the negative x axis direction and the built-in electric field may perform field-free switching on the magnetization direction of a free layer aligned in the negative z axis direction ("down" state) to the positive z axis direction ("down" state).

In Step of applying the read voltage $V_{DR}$ to the first electrode 138 to read tunnel resistance of a magnetic tunnel junction by free layer/tunnel barrier layer/fixed layer, the tunnel resistance may be detected by detecting the current ID flowing in the first electrode 138.

A step of applying an erase gate voltage having a sign opposite to the first auxiliary program gate voltage $V'_{GP1}$ to the second gate electrode 344" to remove the second polarity program state formed in the second charge storage layer 342" may remove charges stored in the second charge storage layer 342" or move the charges in an opposite direction. When the second charge storage layer 342" is in an erased state by the erase gate voltage, field-free switching does not occur. For field-free switching, a programming step is required again.

When a first charge storage layer is in a programmed state, an in-plane current applied in a positive x axis direction switches a "down" state to an "up" state. Meanwhile, when a second charge storage layer is in a programmed state, an in-plane current applied in the positive x axis direction switches an "up" state to a "down" state. This opposite polarity switching properties are interpreted to be due to the direction of spin polarization based on asymmetry. Such properties may allow a logic operation to be performed by using an in-plane current as a first input, a gate voltage as a second input, and using the magnetization direction of a free layer as an output.

Referring to FIG. 9, a method for switching a free layer using only a positive in-plane current is shown. S210 By applying the first program gate voltage $V_{GP1}$ to the first gate electrode 344' to accumulate charges in or move the charges to the first charge storage layer 342', programming the first charge storage layer 342' to a first polarity is performed.

Thereafter, when in a first polarity program state of the first charge storage layer 342', S220 by applying the in-plane current I_inplane to the conductive layer 120, the magnetization direction M_free of the free layer 132 is switched.

Thereafter, when in the first polarity program state of the first charge storage layer 342', S240 by applying the erase gate voltage $V_{ER1}$ having a sign opposite to the first program gate voltage $V_{GP1}$ to the first gate electrode 344', the first polarity program state formed in the first charge storage layer 342' is removed.

Thereafter, by applying the first auxiliary program gate voltage $V'_{GP1}$ to the second gate electrode 344" to accumulate charges in or move the charges to the second charge storage layer 342", programming the second charge storage layer 342" to a second polarity is performed.

Thereafter, when in a second polarity program state of the second charge storage layer 342", by applying the in-plane current I_inplane to the conductive layer 120, the magnetization direction M_free of the free layer 132 is switched.

Thereafter, when in the second polarity program state of the second charge storage layer 342", by applying an erase gate voltage $V'_{ER1}$ having a sign opposite to the first auxiliary program gate voltage to the second gate electrode 344", the second polarity program state formed in the second charge storage layer 342" is removed.

Thereafter, the above operations may be repeated to switch a free layer using a positive in-plane current.

According to a modified embodiment of the inventive concept, the first charge storage layer 342' may be programmed to a second polarity by the second program gate voltage $V_{GP2}$. The first charge storage layer 342' may be removed by the erase gate voltage $V_{ER2}$ having a polarity opposite to that of the second program gate voltage $V_{GP2}$.

According to a modified embodiment of the inventive concept, the second charge storage layer 342" may be programmed to a first polarity by a second auxiliary program gate voltage. The second charge storage layer 342" may be removed by an erase gate voltage having a polarity opposite to that of the second auxiliary program gate voltage.

Hereinafter, experimental results for confirming the operation principle of the inventive concept will be described.

In a structure of broken inversion symmetry, known as the Rashba effect, a spin-orbit coupling effect facilitates a spin-orbit torque (SOT) in a structure of heavy metal/ferromagnetic material/oxide structure or in a structure of conductive layer 120/free layer 132/tunnel barrier layer 134 together with a spin Hall effect. The structure used in the present experiment is a Pt/Co/AlOx structure. The Rashba effect of the Pt/Co/AlOx structure is laterally modulated by an electric voltage, thereby generating an out-of-plane SOT.

Through the above, field-free switching of perpendicular magnetization and electrical control of a switching polarity are possible. When a gate oxide (or a charge storage layer) is changed, a sign of the out-of-plane SOT is inverted while maintaining the same sign of voltage-controlled magnetic anisotropy, thereby confirming that the Rashba effect is a key factor in the electric field modulation at a Co/oxide interface. Electrical control of a SOT switching polarity in a reversible and non-volatile manner may be utilized for programmable operations in spintronic logic-in-memory devices.

The spin-orbit torque (SOT) is a spin torque generated in the spin-orbit coupling of a structure of heavy metal HM/ferromagnetic material FM/oxide structure (or a structure of the conductive layer 120/free layer 132/tunnel barrier layer 134). A spin current generated by a spin Hall effect in the heavy metal HM, or by a heavy metal and the Rashba effect at interfaces of HM/FM and/or FM/oxide applies a torque to the ferromagnetic material FM and switches magnetization direction. An SOT providing fast and energy-efficient magnetization switching and domain wall motion is being studied for a technology for manipulating the magnetization of various spintronic devices including magnetic random access memory, spintronic logic, and oscillators.

A spin Hall effect is of bulk properties originated from spin-orbit coupling of the heavy metal HM, but the Rashba effect occurs at an interface in which a broken inversion symmetry of a heterostructure of the heavy metal HM/ferromagnetic material FM is present.

Electrical control of the Rashba effect has been demonstrated at a semiconductor interface. However, the electrical control of the Rashba effect has not been clearly reported for metal structures so far for the following reasons. Firstly, due to the Coulomb screening effect, the application of an electric field to a metal structure is limited to one or two atomic layers. Secondly, it is difficult to distinguish changes due to Rashba effect and accompanying changes in magnetic properties due to an applied gate voltage.

Voltage control of magnetism has been actively studied because it reduces power consumption for magnetization switching without deteriorating thermal stability. According to recent studies, an SOT of a structure of the heavy metal HM/ferromagnetic material FM/oxide is controlled using a gate voltage by controlling the oxygen concentration at an interface by inducing the movement of oxygen ions.

In the inventive concept, using two gates and a charge storage layer, lateral modulation of the Rashba effect in the structure Pt/Co/AlOx may generate an out-of-plane SOT to electrically control field-free switching of perpendicular magnetization.

Figure 10A:
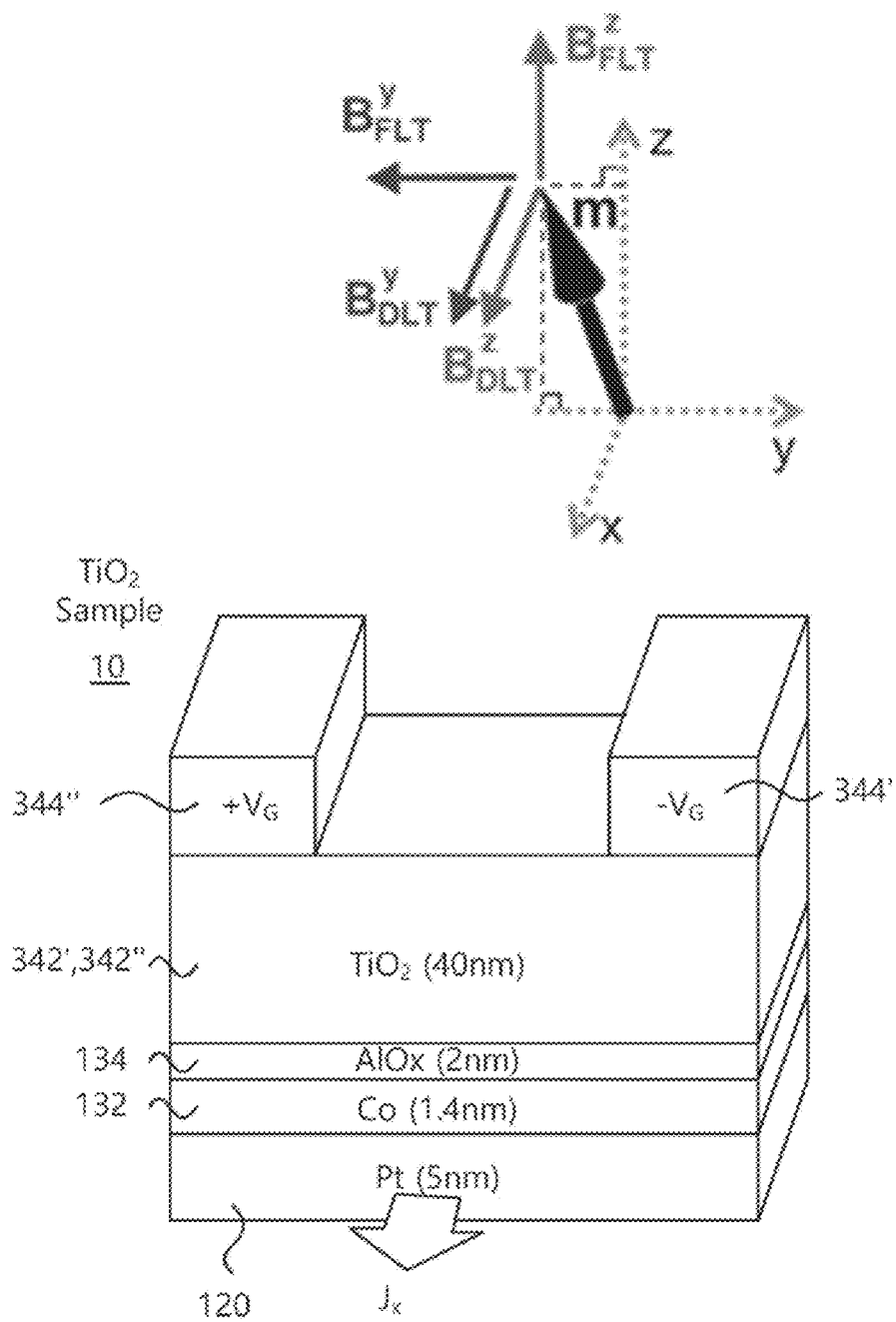
FIG. 10A is a schematic view of gate voltage induced lateral symmetry breaking for field-free SOT switching in a Pt/Co/AlOx/TIO$_2$ sample.

FIG. 10A is a schematic view of gate voltage induced lateral symmetry breaking for field-free SOT switching in a Pt/Co/AlOx/TiO$_2$ sample.

Figure 10B:
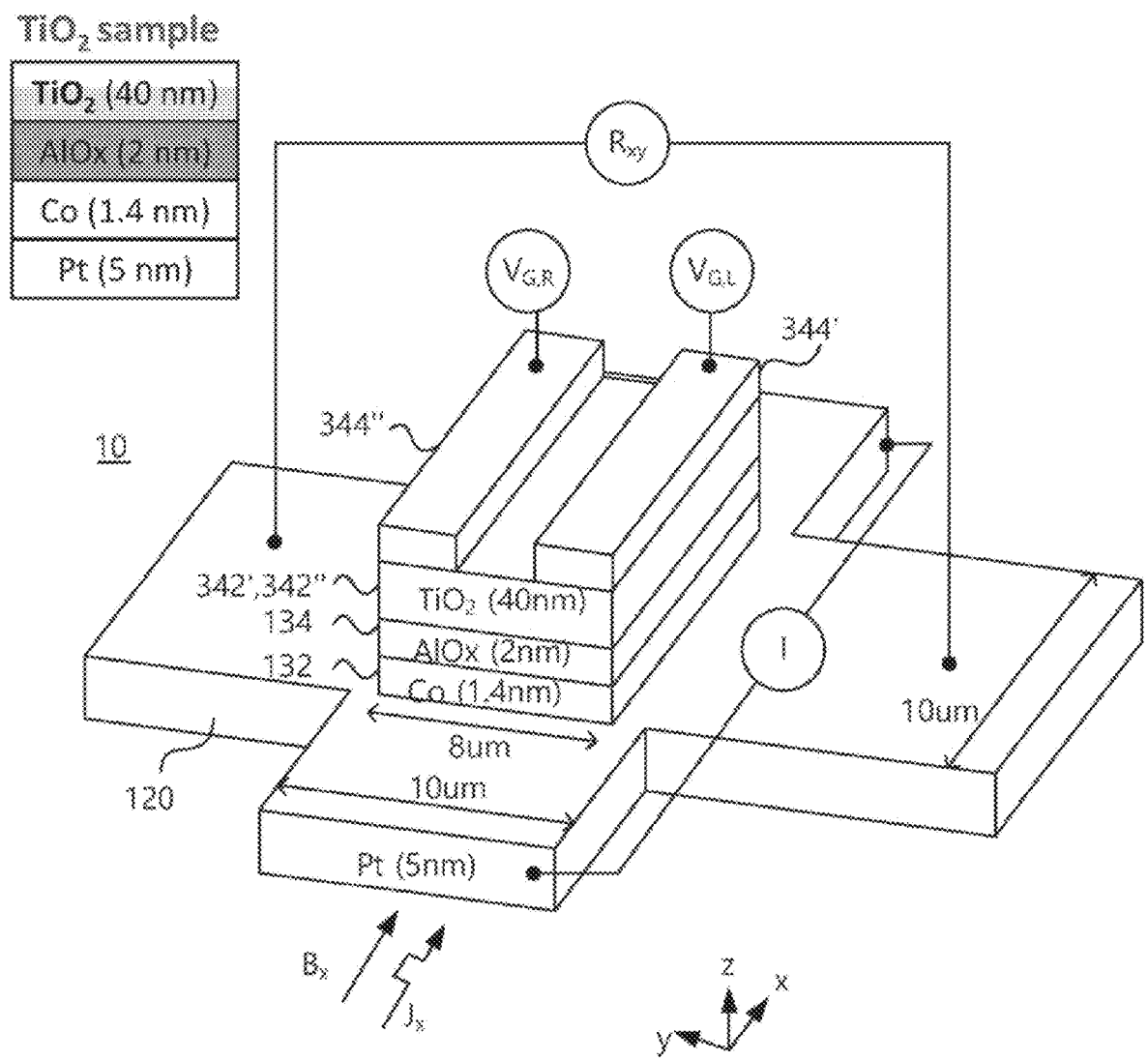
FIG. 10B is a schematic view of a hall bar device having two side gates and a sample structure of Pt/Co/AlOx/TIO$_2$.

FIG. 10B is a schematic view of a hall bar device having two side gates and a sample structure of Pt/Co/AlOx/TiO$_2$.

Figure 10C:
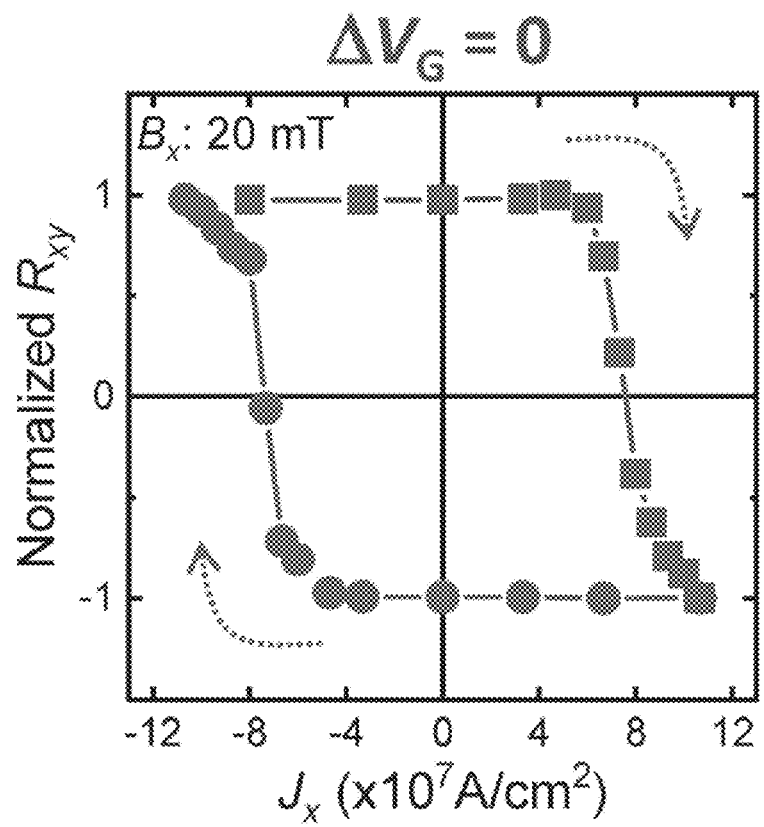
FIG. 10C shows Current density ($J_x$)-Hall resistance ($R_{xy}$) for current induced SOT switching when $\Delta V_G=0(V_{G,L}=V_{G,R}=0$ V) and $B_x=20$ mT.

FIG. 10C shows Current density ($J_x$)-Hall resistance ($R_{xy}$) for current induced SOT switching when $\Delta V_G=0(V_{G,\ L}=V_{G,\ R}=0$ V) and $B_x=20$ mT.

Figure 10D:
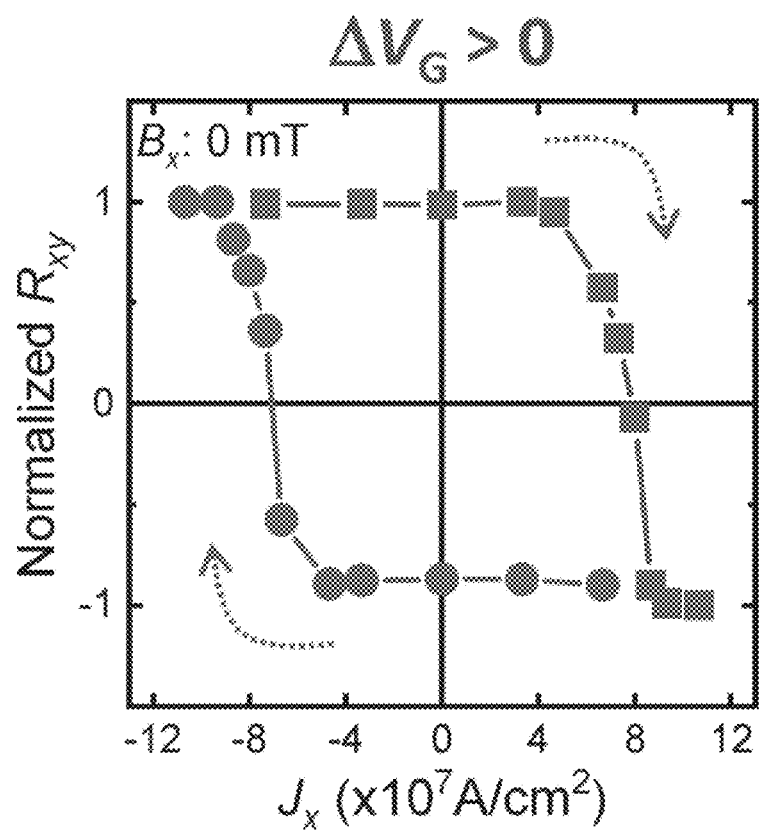
FIG. 10D shows Current density ($J_x$)-Hall resistance ($R_{xy}$) for field-free SOT switching when $\Delta V_G>0(V_{G,L}=+8$ V, $V_{G,R}=0$ V)

FIG. 10D shows Current density ($J_x$)-Hall resistance ($R_{xy}$) for field-free SOT switching when $\Delta V_G>0(V_{G,\ L}=+8$ V, $V_{G,\ R}=0$ V).

Figure 10E:
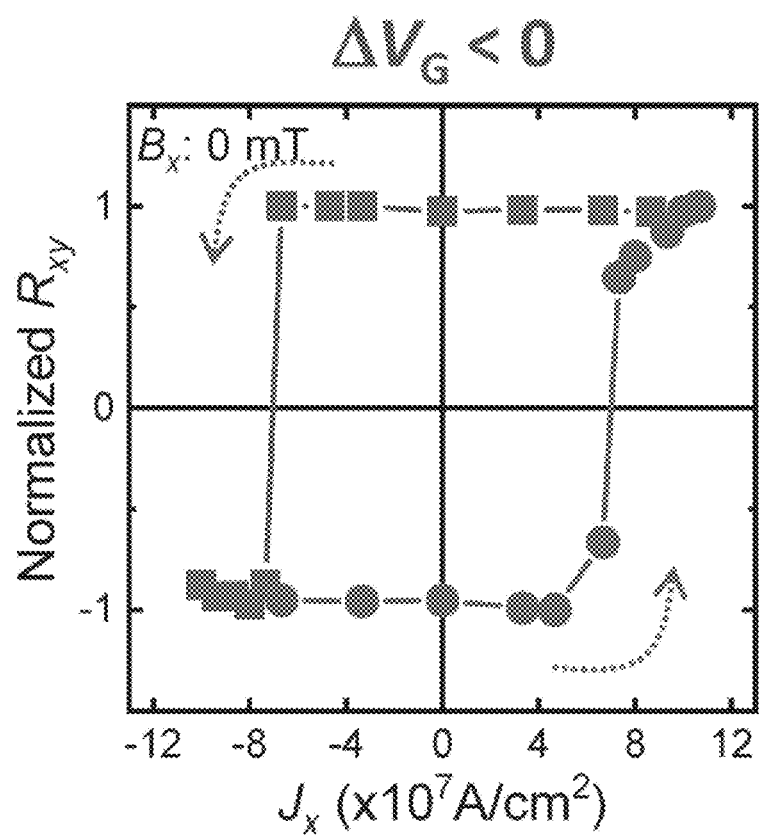
FIG. 10E shows Current density ($J_x$)-Hall resistance ($R_{xy}$) for field-free SOT switching when $\Delta V_G<0(V_{G,L}=0$ V, $V_{G,R}=+8$ V)

FIG. 10E shows Current density ($J_x$)-Hall resistance ($R_{xy}$) for field-free SOT switching when $\Delta V_G<0(V_{G,\ L}=0$ V, $V_{G,\ R}=+8$ V). 8 V corresponds to an electric field of 2.5 mV/cm. Here, the blue (or red) dotted arrows indicate the switching direction from top to bottom (or from bottom to top).

Referring to FIG. 10A, a gate voltage difference $\Delta V_G$ induces electric field modulation along a y direction to generate additional lateral symmetry breaking. Using an in-plane charge current along an x direction, the above lateral symmetry breaking generates an out-of-plane spin orbit field (red arrow). A field-like effective field is $B_{FLT}^z$, and a damping-like effective field is $B_{DLT}^z$.

This generates an additional SOT (z-SOT) in a m×z direction by $B_{FLT}^z$ and in a m×(m×z) direction by $B_{DLT}^z$. Here, m is on a y-z plane. The blue arrow represents a planar spin-orbit field ($B_{FLT}^y$ and $B_{DLT}^y$) induced by symmetry breaking along a z direction.

Referring to FIG. 10A and FIG. 10B, a sample 10 removed the fixed layer 136 and the first electrode 138 from the magnetic device 100 described with reference to FIG.

1A. In addition, in order to detect properties of the free layer 132, the conductive layer 120 was prepared in a hall bar shape (or a cross shape).

When different gate voltages are applied to the two side gate electrodes 344' and 344" in the sample 10, additional lateral symmetry breaking occurs along the y direction. When there is an in-plane charge current (or a current density $J_x$) of the conductive layer 120 along the x direction, a symmetry analysis shows that lateral symmetry breaking along the y direction generates the additional SOT in the m×z and m×(m×z) directions. Here, m and z are unit vectors along the magnetization and thickness directions, respectively. The out-of-plane SOT or the z-SOT may switch perpendicular magnetization of the free layer 132 without an external magnetic field, and the z-SOT may reduce a switching current greatly.

In the inventive concept, it is shown that the z-SOT and associated switching polarity may be controlled by a gate voltage in a reversible and nonvolatile manner, and there are provided logic operations programmable in spintronic logic-in-memory devices as described below.

In addition, there is provided a microscopic cause of the z-SOT induced by asymmetric gate voltages. The above symmetry analysis is valid regardless of the cause of the lateral symmetry breaking along the y direction.

However, in order to further improve device performance, it is very important to identify a microscopic origin of electric-field-induced lateral symmetry breaking. To this end, the dependence of the z-SOT on a gate oxide material was analyzed. In the same Pt/Co/AlOx structure, the direction of the z-SOT is inverted by changing a gate oxide from $TiO_2$ to $ZrO_2$. The two gate oxides exhibit opposite electric field effects on a potential barrier. In the case of $TiO_2$, a positive voltage reduces the height of the potential barrier to change a built-in electric field and the associated Rashba effect at an Co/oxide interface. In the case of $ZrO_2$, a positive voltage increases the height of the potential barrier to change the built-in electric field and the associated Rashba effect at an Co/oxide interface.

This suggests that, along with the same sign of a voltage-controlled magnetic anisotropy effect regardless of a gate oxide, the z-SOT is mainly due to lateral modulation of the Rashba effect at a Co/AlOx interface. Modulation of the Rashba effect by a gate voltage is demonstrated by the gate voltage dependence measurement of a field-like SOT.

[Electric Field Control of Deterministic Spin-Orbit Torque Switching]

Referring to FIG. 10B, in order to demonstrate a z-SOT generated by an asymmetric gate voltage, a Pt (5 nm)/Co (1.4 nm)/AlOx (2 nm) hall bar device 10 was prepared. Here, at two side gates, gate oxides 342' and 342" of $TiO_2$ (40 nm) and gate electrodes 344' and 344" of Ru (50 nm) are integrated.

Referring to FIGS. 10C to 10E, SOT-induced switching measurement of a sample according to the polarity of $\Delta V_G$ is shown. Here, $\Delta V_G$ is the difference in voltages applied to the left ($V_{G,L}$) and right ($V_{G,R}$) gate electrodes 344' and 344" with respect to a ground connected to the conductive layer 120.

Referring to FIG. 10C, when a gate voltage (e.g.: $\Delta V_G$=0 (($V_{G,L}$=$V_{G,R}$=0 V)) is not applied, the sample 10 shows a typical SOT switching operation which occurs only when an in-plane electric field $B_x$ is applied. A positive in-plane current prefers up-down switching in a positive $B_x$. The switching polarity corresponds to switching polarity by a positive spin Hall angle of Pt, which is the conductive layer 120.

Referring to FIGS. 10D and 10E, when $\Delta V_G$, which is not 0, is applied, a sample shows deterministic SOT switching even when the in-plane electric field $B_x$ is not present. In addition, switching polarity is determined by a $\Delta VG$ sign. A positive in-plane current $J_x$ prefers up-down switching for $\Delta V_G$>0($V_{G,L}$=+8 V, $V_{G,R}$=0 V). The positive in-plane current $J_x$ prefers down-up switching for $\Delta V_G$<0($V_{G,L}$=0V, $V_{G,R}$=+8V). The field-free deterministic SOT switching demonstrates the z-SOT due to $\Delta V_G$ breaking lateral symmetry.

Scanning transmission electron microscopy and electron-energy loss spectroscopy measurement results show that $\Delta V_G$ induces re-distribution of oxygen ions in an oxide depending on polarity.

When a positive gate voltage ($\Delta V_G$>0) is applied, the oxygen ion concentration on one side is greater than the oxygen ion concentration of the other side. This may be a cause of lateral asymmetry by a voltage. It is emphasized that the device has a unique advantage in that a deterministic SOT polarity may be electrically controlled.

This electrical controllability cannot be achieved with previously reported ones demonstrating z-SOT through inversion symmetry breaking either by employing a material of low crystal symmetry or by introducing structural asymmetry.

In addition, such an electrical control function may provide programmable logic operations in memory devices, which are spintronic logic. A first input is the direction of an in-plane current, a second input is a voltage applied to a first gate electrode and a second gate electrode, and an output may be the magnetization state of a free layer.

Figure 11A:
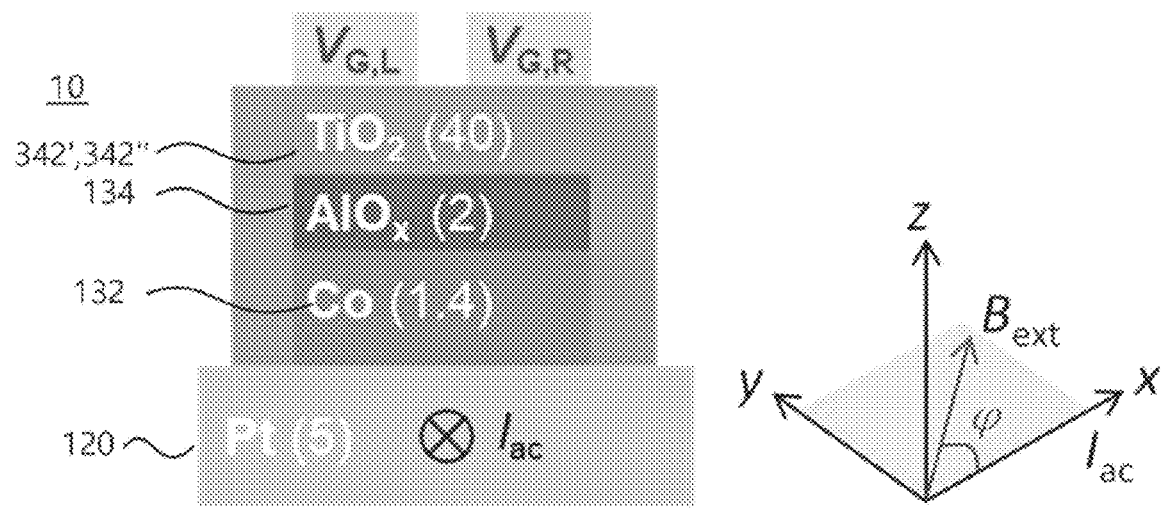
FIG. 11A is a schematic view of a measurement structure for measuring harmonic spin orbit torque in a Pt/Co/AlOx/TIO$_2$ sample; Secondary harmonic hall resistance ($R_{xy}^{2\omega}$) for an alternating current is measured while rotating the sample on a plane (azimuth $\varphi$) under an external magnetic field $B_{ext}$.

FIG. 11A is a schematic view of a measurement structure for measuring harmonic spin orbit torque in a Pt/Co/AlOx/$TiO_2$ sample. Secondary harmonic hall resistance ($R_{xy}^{2\omega}$) for an alternating current is measured while rotating the sample on a plane (azimuth φ) under an external magnetic field $B_{ext}$.

Figure 11B:
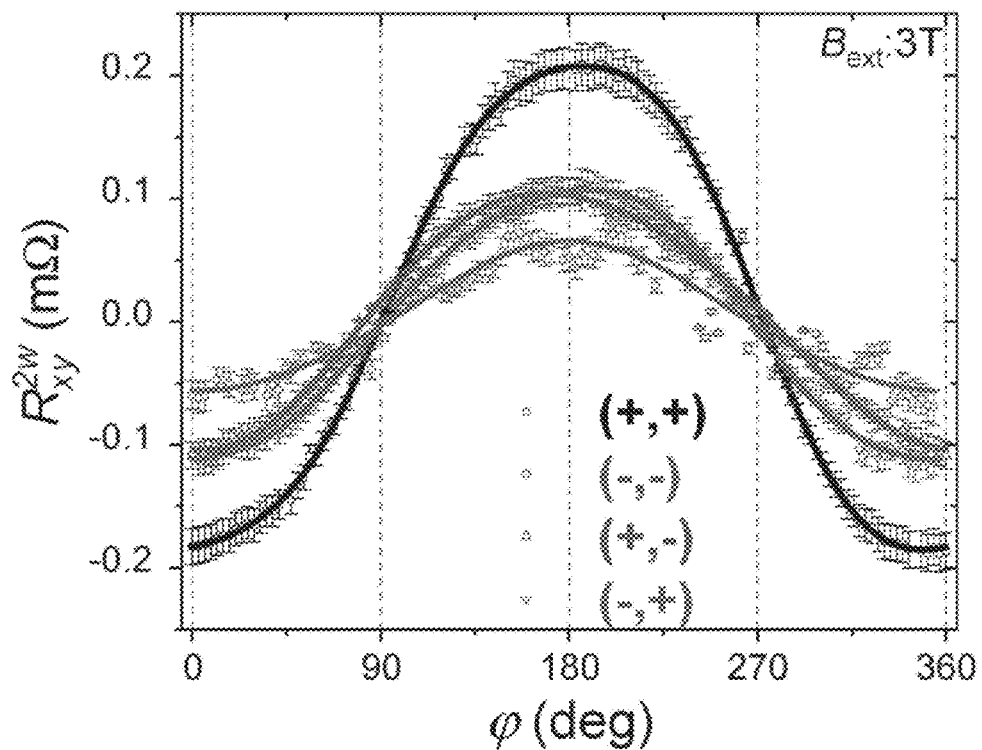
FIG. 11B is a secondary harmonic hall resistance ($R_{xy}^{2\omega}$) curve for $\varphi$ of a TiO$_2$ sample having 4 different $V_G$ combinations and $B_{ext}=3T$.

FIG. 11B is a secondary harmonic hall resistance ($R_{xy}2\omega$) curve for φ of a $TiO_2$ sample having 4 different $V_G$ combinations and $B_{ext}$=3T.

Figure 11C:
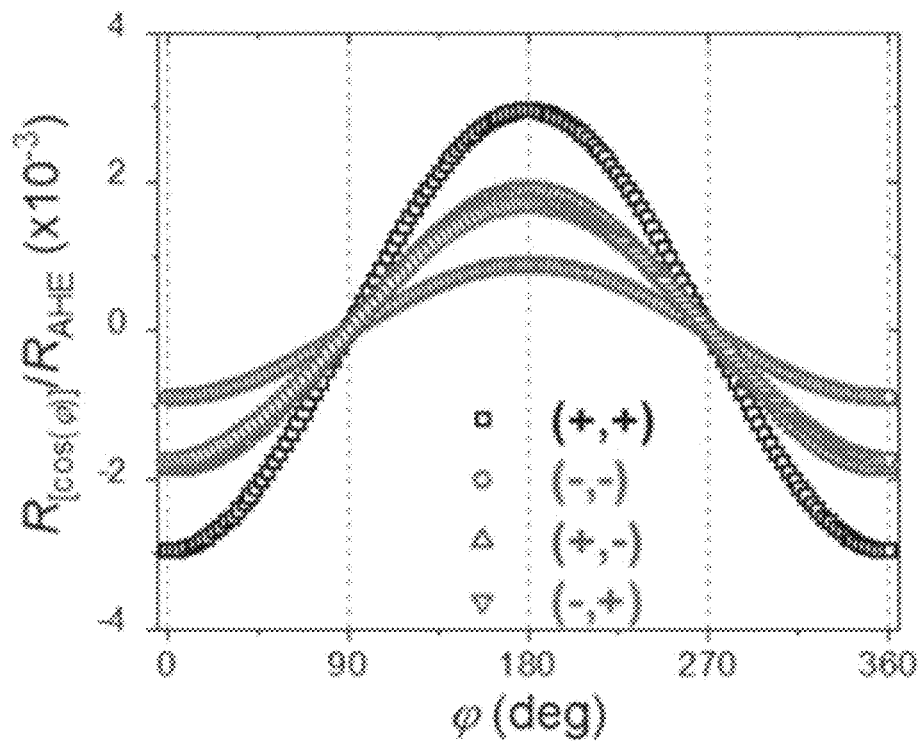
FIG. 11C shows an extracted cos $\varphi$ component of a secondary harmonic hall resistance ($R_{xy}^{2\omega}$)

FIG. 11C shows an extracted cos φ component of a secondary harmonic hall resistance ($R_{xy}^{2\omega}$).

Figure 11D:
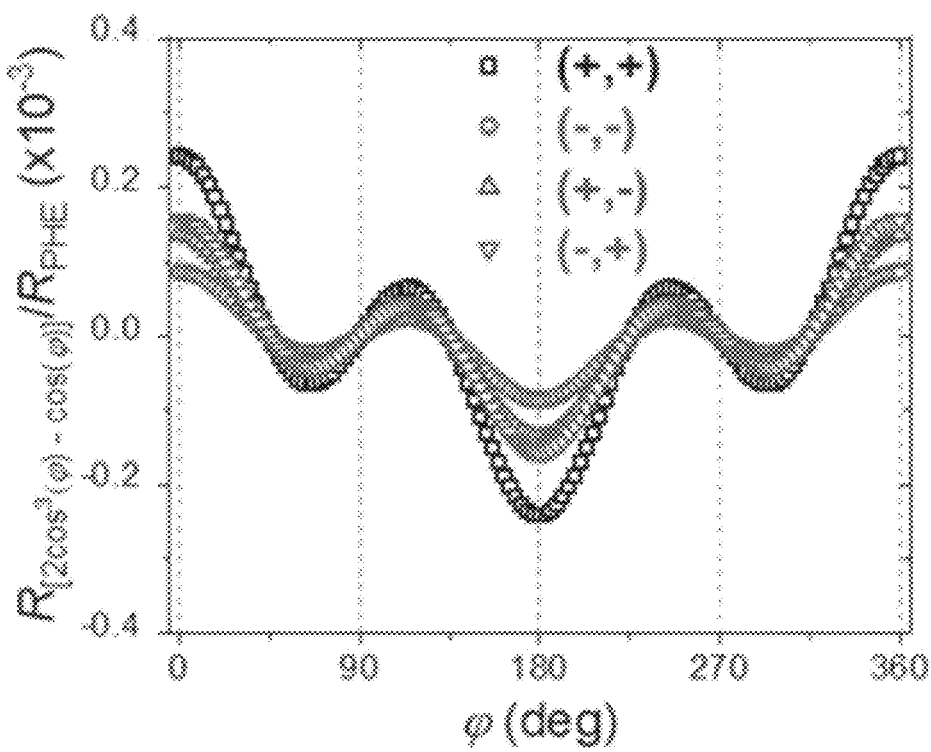
FIG. 11D shows an extracted (2 cos$^3\varphi$–cos $\varphi$) component of a secondary harmonic hall resistance ($R_{xy}^{2\omega}$)

FIG. 11D shows an extracted (2 $\cos^3$φ–cos φ) component of a secondary harmonic hall resistance ($R_{xy}^{2\omega}$).

Figure 11E:
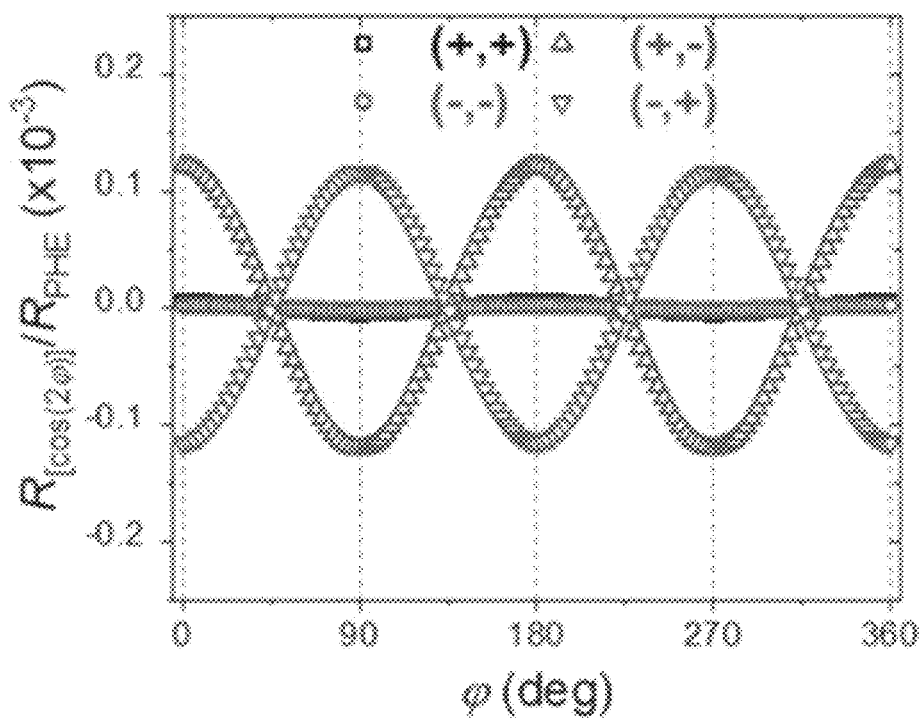
FIG. 11E shows an extracted cos 2$\varphi$ component of a secondary harmonic hall resistance ($R_{xy}^{2\omega}$)

FIG. 11E shows an extracted cos 2φ component of a secondary harmonic hall resistance ($R_{xy}^{2\omega}$).

Figure 11F:
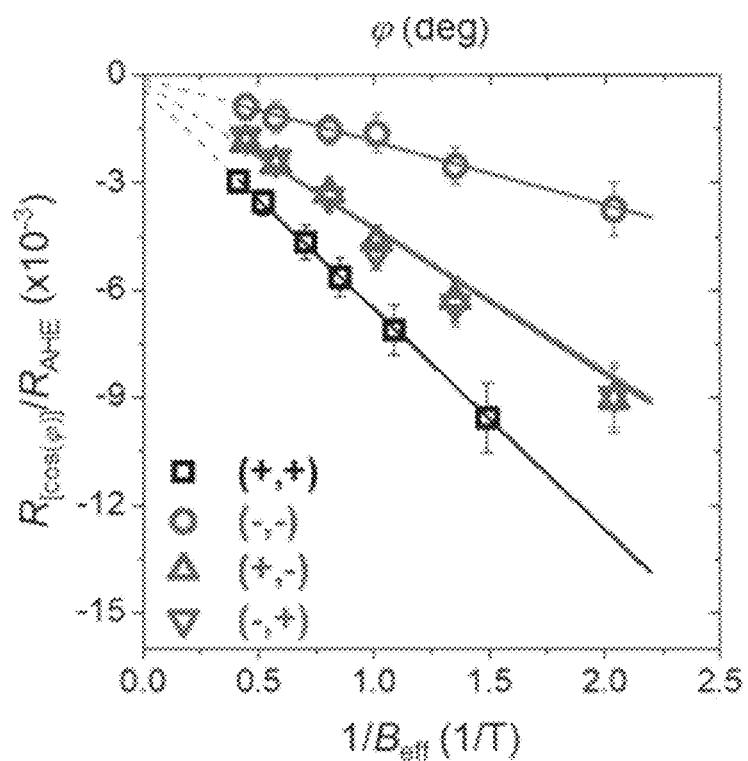
FIG. 11F shows a cos $\varphi$ component plotted as a function of $1/B_{eff}$ (or $1/B_{ext}$)

FIG. 11F shows a cos φ component plotted as a function of $1/B_{eff}$ (or $1/B_{ext}$).

Figure 11G:
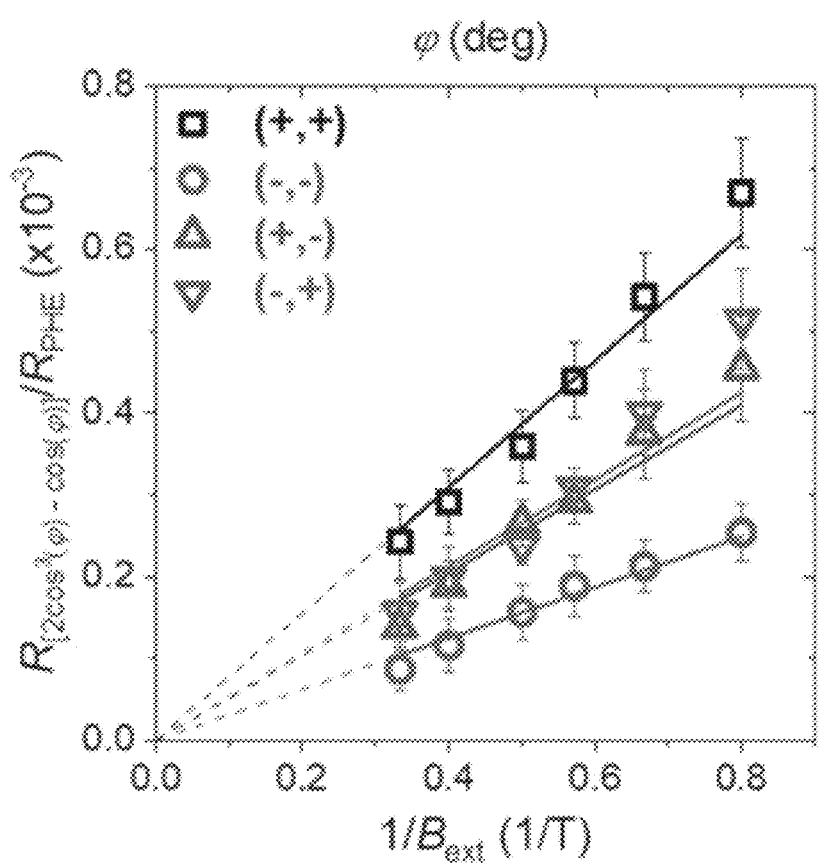
FIG. 11G shows a (2 cos$^3\varphi$–cos $\varphi$) component plotted as a function of $1/B_{eff}$ (or $1/B_{ext}$)

FIG. 11G shows a (2 $\cos^3$φ–cos φ) component plotted as a function of $1/B_{eff}$ (or $1/B_{ext}$).

Figure 11H:
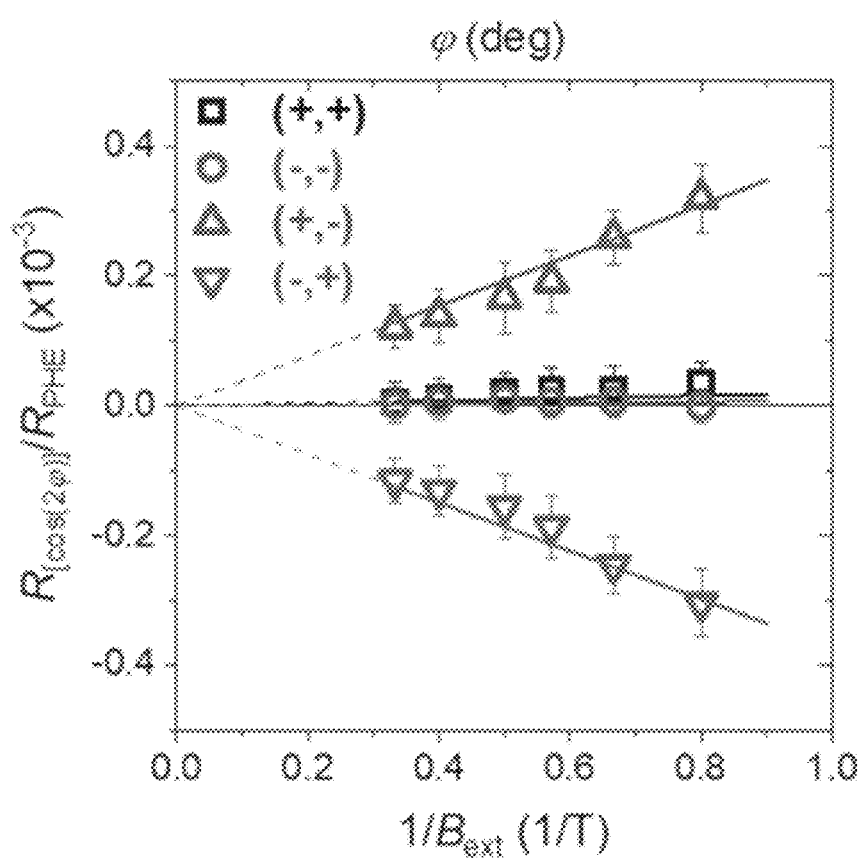
FIG. 11H shows a cos 2$\varphi$ component plotted as a function of $1/B_{eff}$ (or $1/B_{ext}$)

FIG. 11H shows a cos 2φ component plotted as a function of $1/B_{eff}$ (or $1/B_{ext}$).

Referring to FIG. 11A to FIG. 11H, next, in-plane harmonic measurement including primary and secondary harmonic hole resistance $R_{xy}^{1\omega}$ and $R_{xy}^{2\omega}$ is performed to systematically test a z-SOT in a Pt/Co/AlOx/$TiO_2$ structure ($TiO_2$ sample). The primary and secondary harmonic hole resistance $R_{xy}^{1\omega}$ and $R_{xy}^{2\omega}$ are measured with an alternating current. Under a fixed in-plane magnetic field $B_{EXT}$, measurement is performed with an alternating current Iac while rotating a sample (azimuth φ). $R_{xy}^{2\omega}$ is given as follows.

[Equation 1]

$$R_{xy}^{2\omega}(\varphi) = \left(R_{AHE}\frac{B_{DLT}^y}{B_{eff}} + R_{VT}^{2\omega}\right)\cos\varphi + 2R_{PHE}\frac{B_{FLT}^y + B_{Oe}}{B_{ext}}(2\cos^3\varphi - \cos\varphi) - 2R_{PHE}\frac{B_{DLT}^z}{B_{ext}}\cos 2\varphi + R_{AHE}\frac{B_{FLT}^z}{B_{eff}}, \quad (1)$$

Here, $R_{AHE}$ and $R_{PHE}$ are respectively abnormal hole resistance and planar hole resistance. $B_{DLT}^y$ is a damping-like effective field originated from an existing y-spin accumulation (y-SOT), and $B_{FLT}^y$ is a field-like effective field originated from the existing y-spin accumulation (y-SOT).

$B_{DLT}^z$ is a damping-like effective field additionally generated by the z-SOT. $B_{FLT}^z$ is a field-like effective field additionally generated by the z-SOT. $B_{Oe}$ is an Oersted field. $B_{eff}$ is an effective magnetic field, and is defined by $B_{eff}=B_{ext}+B_{dem}-B_{ani}$. Here, $B_{dem}-B_{ani}$ are a demagnetization field of the FM and an anisotropy field thereof, respectively. $R_{VT}^{2\omega}$ is an abnormal Nernst contribution. Particularly, $B_{DLT}^z$ has cos 2φ dependency, which may be clearly distinguished when the z-SOT is generated in the sample. $B_{FLT}^z$ generates an angle-independent offset which is difficult to identify in a harmonic hall signal.

A sample is examined under four gate voltage conditions: $V_G^{(+,+)}$($V_{G,L}=V_{G,R}=8$ V), $V_G^{(-,-)}$($V_{G,L}=V_{G,R}=-8$ V), $V_G^{(+,-)}$($V_{G,L}=8$ V and $V_{G,R}=-8$ V), and $V_G^{(-,+)}$($V_{G,L}=-8$ V and $V_{G,R}=8$ V). $\Delta V_G=0$ is for $V_G^{(+,+)}$ and $V_G^{(-,-)}$. $\Delta V_G>0$ is for $V_G^{(+,-)}$. $\Delta V_G<0$ is for $V_G^{(-,+)}$.

Referring to FIG. 11B, representative measurement data of $R_{xy}^{2\omega}$ measured when $B_{ext}=3$ T are shown with respect to the above voltage conditions. Here, cos φ, (2 cos 3φ–cos φ) and cos 2φ components were separated.

Referring to FIG. 11E, it is shown that a cos 2φ component appears only in the sample under an asymmetric gate voltage (that is, $V_G^{(+,-)}$ and $V_G^{(-,+)}$).

The measurement is repeated using a different $B_{ext}$, and each component is plotted in FIG. 11F-H as a function of $B_{eff}$ (or $B_{ext}$).

Referring to FIG. 11F to FIG. 11H, asymmetric gate voltage (=$\Delta V_G$) dependence of $B_{DLT}^y$, $B_{FLT}^y$, and $B_{DLT}^z$ are evaluated at the slope of a graph. Two interesting observations are notable.

First, when a positive voltage is applied to two gates, $B_{DLT}^y$ and $B_{FLT}^y$ due to the y-SOT are improved. When a negative voltage is applied to two gates, $B_{DLT}^y$ and $B_{FLT}^y$ due to the y-SOT are reduced. $B_{DLT}^y$ and $B_{FLT}^y$ are greater with respect to $V_G^{(+,+)}$ than with respect to $V_G^{(-,-)}$. $B_{DLT}^y$ and $B_{FLT}^y$ are not significantly different for the application of an asymmetric voltage of $V_G^{(+,-)}$ or $V_G^{(-,+)}$. The results show that the y-SOT may be quantitatively modulated by symmetric gate voltage [$V_G^{(+,+)}$ and $V_G^{(-,-)}$].

Second, significant $B_{DLT}^z$ due to the z-SOT occurs when applying the asymmetric voltages ($V_G^{(+,-)}$, $V_G^{(-,+)}$, and non-zero $\Delta V_G$). The magnitude of $B_{DLT}^z$ is +0.38±0.02 mT for a current density of 1×10$^7$ A/cm$^2$ for $\Delta V_G>0$. The magnitude of $B_{DLT}^z$ is about 10% of $B_{DLT}^y$.

Using a variety of $\Delta V_G$, a hysteresis loop shift experiment of the sample was performed to further confirm z-SOT, and the results are consistent with the results of SOT switching and in-plane harmonic measurements.

The amount of hysteresis loop shift gradually increases as an in-plane current increases without representing a critical current which should overcome intrinsic damping. This indicates the presence of $B_{FLT}^z$, which cannot be clearly identified by harmonics.

In order to confirm whether a $\Delta V_G$-induced z-SOT is common, another sample having a Pt/Co/AlOx/ZrO$_2$ structure (ZrO$_2$ sample) is examined. In the sample, a gate oxide is replaced with ZrO$_2$, and the rest of the structure remains the same.

Figure 12A:
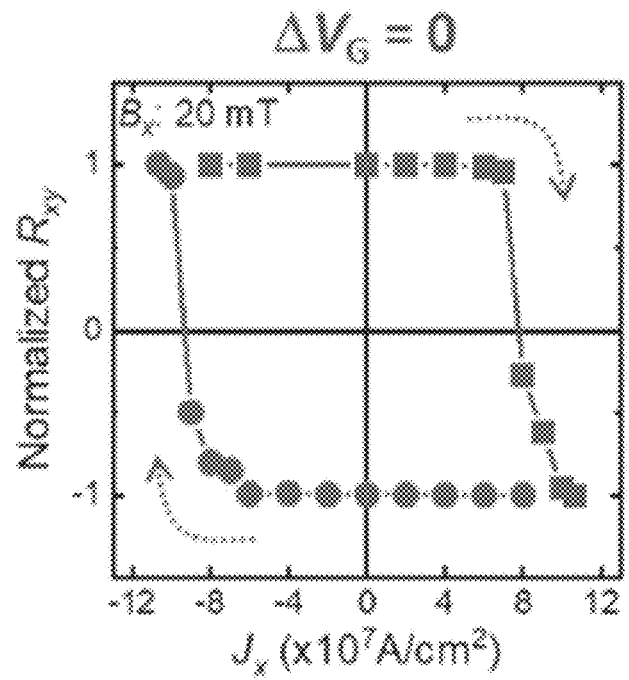
FIG. 12A shows Current density ($J_x$)-Hall resistance ($R_{xy}$) for current induced SOT switching of a Pt/Co/AlOx/ZrO$_2$ sample when $\Delta V_G=0$ and $B_x=20$ mT.

FIG. 12A shows Current density ($J_x$)-Hall resistance ($R_{xy}$) for current induced SOT switching of a Pt/Co/AlOx/ZrO$_2$ sample when $\Delta V_G=0$ and $B_x=20$ mT.

Figure 12B:
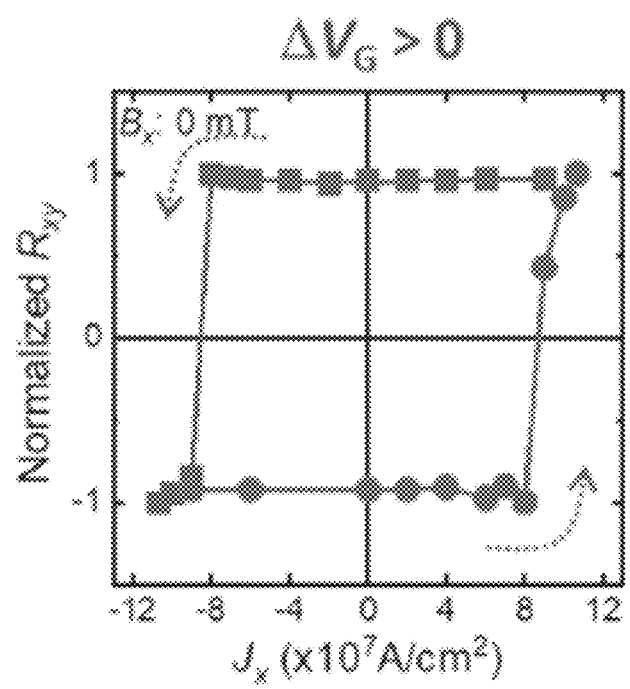
FIG. 12B shows Current density ($J_x$)-Hall resistance ($R_{xy}$) for field-free SOT switching of a Pt/Co/AlOx/ZrO$_2$ sample when $\Delta V_G>0$.

FIG. 12B shows Current density ($J_x$)-Hall resistance ($R_{xy}$) for field-free SOT switching of a Pt/Co/AlOx/ZrO$_2$ sample when $\Delta V_G>0$.

Figure 12C:
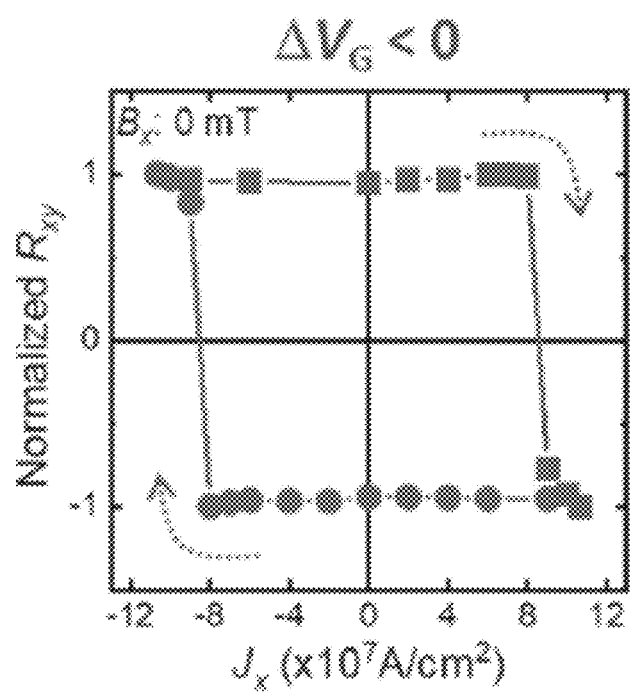
FIG. 12C shows Current density ($J_x$)-Hall resistance ($R_{xy}$) for current induced SOT switching of a Pt/Co/AlOx/ZrO$_2$ sample when $\Delta V_G<0$.

FIG. 12C shows Current density ($J_x$)-Hall resistance ($R_{xy}$) for current induced SOT switching of a Pt/Co/AlOx/ZrO$_2$ sample when $\Delta V_G<0$. Here, the blue (or red) dotted arrows indicate the switching direction from top to bottom (or from bottom to top).

Referring to FIG. 12A to FIG. 12C, results of SOT switching of a Pt (5 nm)/Co (1.4 nm)/AlOx (2 nm)/ZrO$_2$ (40 nm) sample (ZrO$_2$ sample) are shown. Without a gate voltage ($\Delta V_G=0$), up-down switching occurs for a positive in-plane current and a positive $B_x$.

Switching polarity is the same as that of the TiO$_2$ sample. When an asymmetric voltage ($\Delta V_G \neq 0$) is applied, the ZrO$_2$ sample shows a deterministic switching similar to that of the TiO$_2$ sample, which clearly shows the generation of a z-SOT due to $\Delta V_G$.

However, the switching polarity of the ZrO$_2$ sample is opposite to the polarity of the TiO$_2$ sample. A positive in-plane current is advantageous in down-up switching for $\Delta V_G>0$. A negative in-plane current is advantageous in down-up switching for $\Delta V_G<0$. This indicates that the direction of the z-SOT generated in the ZrO$_2$ sample is opposite to the direction of the TiO$_2$ sample. This is demonstrated by further measurement of the z-SOT of the ZrO$_2$ sample using an in-plane harmonic hall and a hysteresis loop shift experiment. Reasons for possible opposite polarity depending on a gate oxide will be discussed later.

[Control of Rashba Effect at Ferromagnetic Material/Oxide Interface]

The physical origin of an electric field induced z-SOT will be discussed. A first possible cause is lateral modulation of PMA through a voltage-controlled magnetic anisotropy (VCMA) effect. An asymmetric gate voltage generates a slope of the PMA, which varies depending on a sign of $\Delta V_G$ along the y direction, thereby providing field-free switching. In order to test the above possibility, the VCMA effect of the TiO$_2$ and ZrO$_2$ samples are measured under four gate voltage conditions: $V_G^{(+,+)}$, $V_G^{(-,-)}$, $V_G^{(+,-)}$, and $V_G^{(-,+)}$.

In a sample with a gate voltage of $V_G^{(-,-)}$, the PMA increases. In a sample with a gate voltage of $V_G^{(+,+)}$, the PMA decreased. No particular variations are found in the PMA under conditions in which gate voltages are $V_G^{(+,-)}$ and $V_G^{(-,+)}$.

Particularly, since the polarity of the VCMA effect is the same in both TiO$_2$ and ZrO$_2$ samples, a $\Delta V_G$-induced PMA gradient along the y direction cannot be accounted for the opposite sign of the z-SOT. Consequently, the VCMA effect is excluded from causes of the z-SOT.

Another possibility is a lateral variation of the Rashba effect at an Co/oxide interface, which may be induced by an asymmetric gate voltage. The magnitude of the Rashba effect is proportional to a built-in electric field generating in a band structure at the boundary of Co/oxide, and is estimated by measuring the height of a potential barrier at a Co (10 nm)/AlOx (2 nm)/gate oxide (5 nm)/Ru (20 nm) tunnel junction, which is dependent on a gate voltage.

Figure 13A:
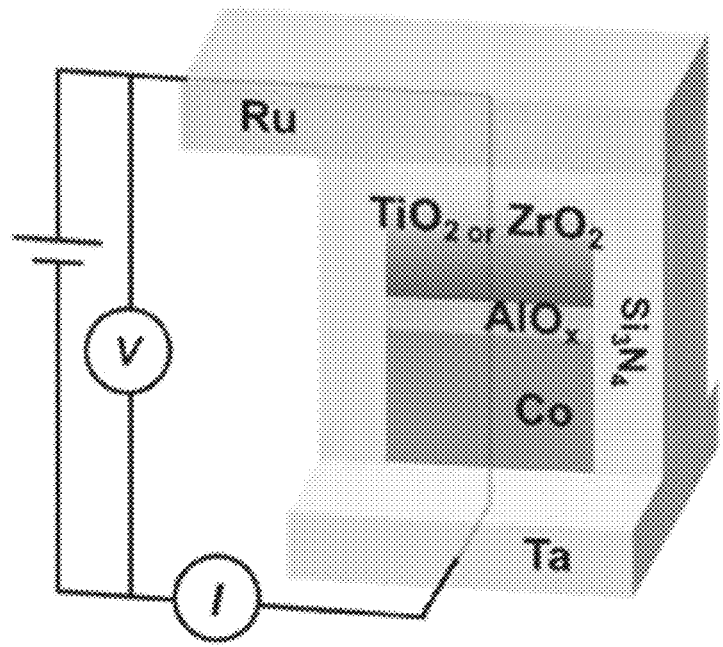
FIG. 13A is a schematic view of a sample (Ta (10 nm)/Co (10 nm)/AlOx (2 nm)/TiO$_2$ (5 nm) or ZrO$_2$ (5 nm)/Ru (20 nm)) for identifying voltage induced variations of a potential barrier and a field-like torque.

FIG. 13A is a schematic view of a sample (Ta (10 nm)/Co (10 nm)/AlOx (2 nm)/TiO$_2$ (5 nm) or ZrO$_2$ (5 nm)/Ru (20 nm)) for identifying voltage induced variations of a potential barrier and a field-like torque.

Figure 13B:
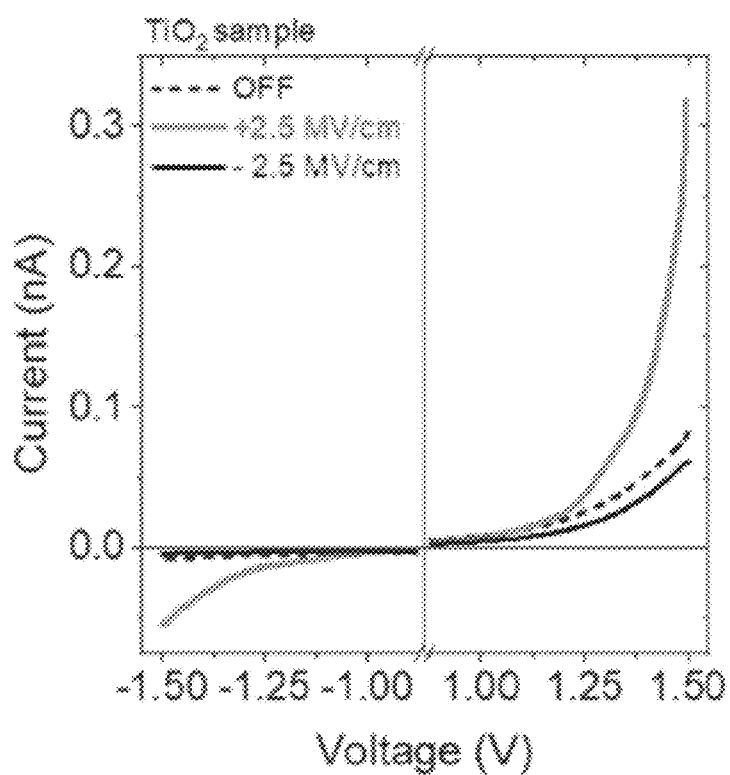
FIG. 13B shows voltage-current properties according to a pre-bias gate voltage $V_G$ in a TiO$_2$ sample (Ta (10 nm)/Co (10 nm)/AlOx (2 nm)/TiO$_2$ (5 nm)/Ru (20 nm))

FIG. 13B shows voltage-current properties according to a pre-bias gate voltage $V_G$ in a TiO$_2$ sample (Ta (10 nm)/Co (10 nm)/AlOx (2 nm)/TiO$_2$ (5 nm)/Ru (20 nm)).

Figure 13C:
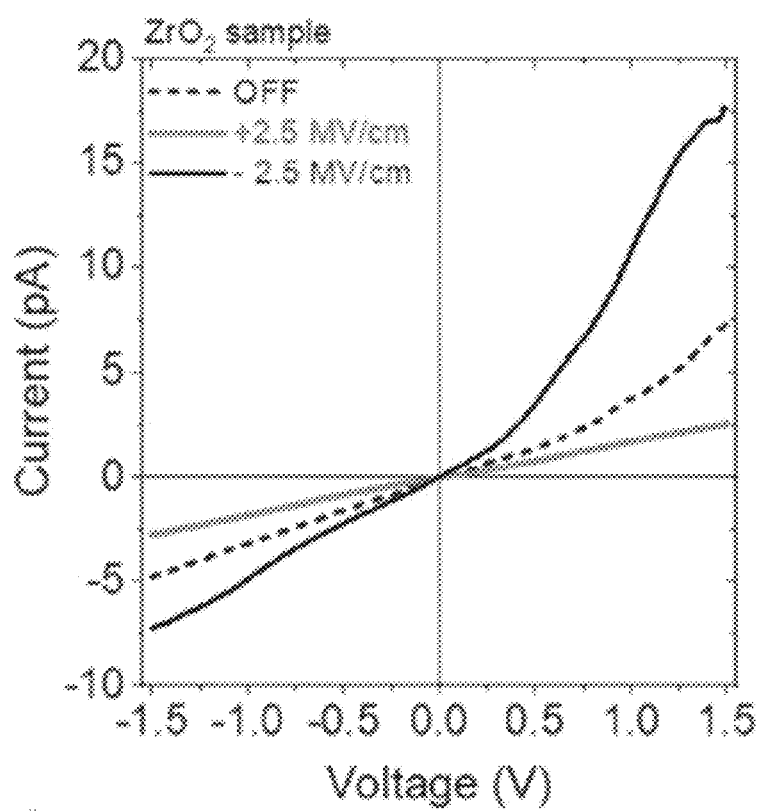
FIG. 13C shows voltage-current properties according to a pre-bias gate voltage $V_G$ in a ZrO$_2$ sample (Ta (10 nm)/Co (10 nm)/AlOx (2 nm)/ZrO$_2$ (5 nm)/Ru (20 nm))

FIG. 13C shows voltage-current properties according to a pre-bias gate voltage $V_G$ in a ZrO$_2$ sample (Ta (10 nm)/Co (10 nm)/AlOx (2 nm)/ZrO$_2$ (5 nm)/Ru (20 nm)).

Referring to FIG. 13A to FIG. 13C, a gate oxide of 5 nm, which is thin enough to allow an electron to pass through a tunnel, is used. FIG. 13B and FIG. 13C show I-V properties of a tunnel junction, and shows that a change in a potential barrier by a gate voltage $V_G$ depends on a gate oxide. After applying a positive $V_G$ to a tunnel junction with TiO$_2$, a tunneling current increases. After applying a negative $V_G$ to the tunnel junction with TiO$_2$, the tunneling current decreases.

Meanwhile, a tunnel junction with ZrO$_2$ shows a reverse electric field effect. The positive $V_G$ decreases the tunnel current and increases a potential barrier.

An opposite field effect may be due to a different transfer mechanism of the oxide. Oxygen ion movement may be the dominant mechanism of TiO$_2$. In addition, charge trapping may be the dominant mechanism of ZrO$_2$.

However, further investigation is required to clarify the gate oxide dependence of an electric field effect. Nevertheless, the above results support a hypothesis that the z-SOT is the result of lateral modulation of a built-in electric field and the associated Rashba effect at the Co/wide interface. The asymmetric gate voltage ($\Delta V_G$) generates a z-SOT by inducing a change in the potential barrier along the y direction. The results explains a different polarity of the z-SOT between TiO$_2$ and ZrO$_2$ samples.

Figure 14A:
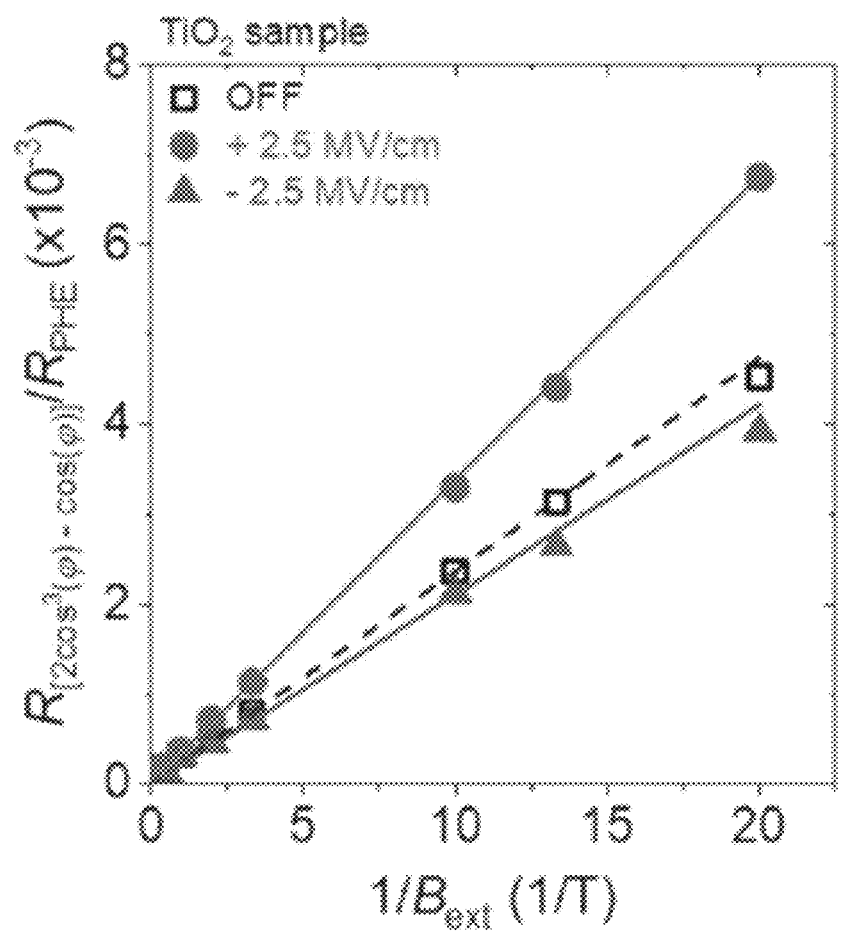
FIG. 14A shows $R_{xy}^{2\omega}$–$1/B_{ext}$ properties according to a pre-bias gate voltage $V_G$ in a TiO$_2$ sample (Pt (0.5 nm)/Co (2 nm)/AlOx (2 nm)/TiO$_2$ (40 nm))

FIG. 14A shows $R_{xy}^{2\omega}$-1/$B_{ext}$ properties according to a pre-bias gate voltage $V_G$ in a TiO$_2$ sample (Pt (0.5 nm)/Co (2 nm)/AlOx (2 nm)/TiO$_2$ (40 nm)).

Figure 14B:
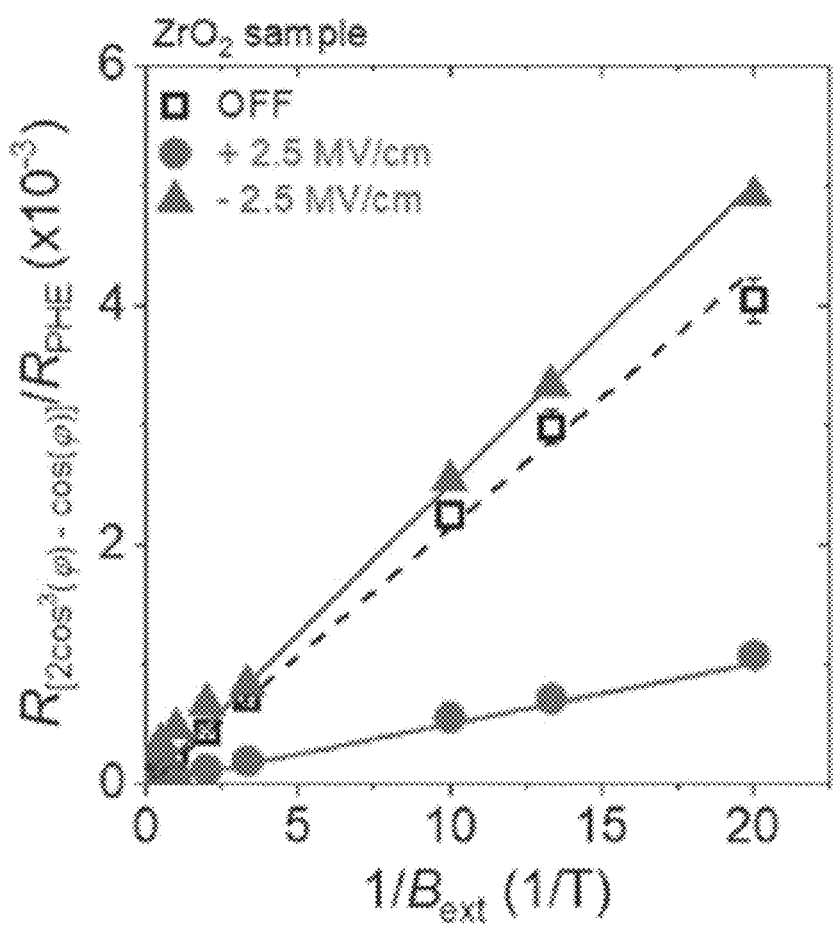
FIG. 14B shows $R_{xy}^{2\omega}$–$1/B_{ext}$ properties according to a pre-bias gate voltage $V_G$ in a ZrO$_2$ sample (Pt (0.5 nm)/Co (2 nm)/AlOx (2 nm)/ZrO$_2$ (40 nm))

FIG. 14B shows $R_{xy}^{2\omega}$-1/$B_{ext}$ properties according to a pre-bias gate voltage $V_G$ in a ZrO$_2$ sample (Pt (0.5 nm)/Co (2 nm)/AlOx (2 nm)/ZrO$_2$ (40 nm)).

In-plane harmonic hall measurement of a Pt (0.5 nm)/Co (2 nm/AlOx (2 nm)/gate oxide (40 nm) sample supports the above scenario. Here, a ferromagnetic layer CO is completely covered by a single gate.

Referring to FIG. 14A and FIG. 14B, as a 1/$B_{ext}$ function depending on $V_G$, a (2 cos$^3$ φ−cos φ) component of $R_{xy}^{2\omega}$ are shown. This shows that the change in $B_{FLT}^y$ according to $V_G$ depends on a gate oxide. For a sample with a TiO$_2$ gate oxide, $B_{FLT}^y$ increases by a positive $V_G$. For a sample with a ZrO$_2$ gate oxide, $B_{FLT}^y$ decreases by the positive $V_G$.

Since the spin Hall effect SHE may be ignored in 0.5 nm Pt, the change in $B_{FLT}^y$ may be attributed to the electric field control Rashba effect. The opposite electric field effect of $B_{FLT}^y$ between TiO$_2$ and ZrO$_2$ samples is consistent with the trend of electric-field control potential barrier height, and supports that the lateral variation of the Rashba effect is a key factor in an electric field-induced z-SOT.

Figure 15A:
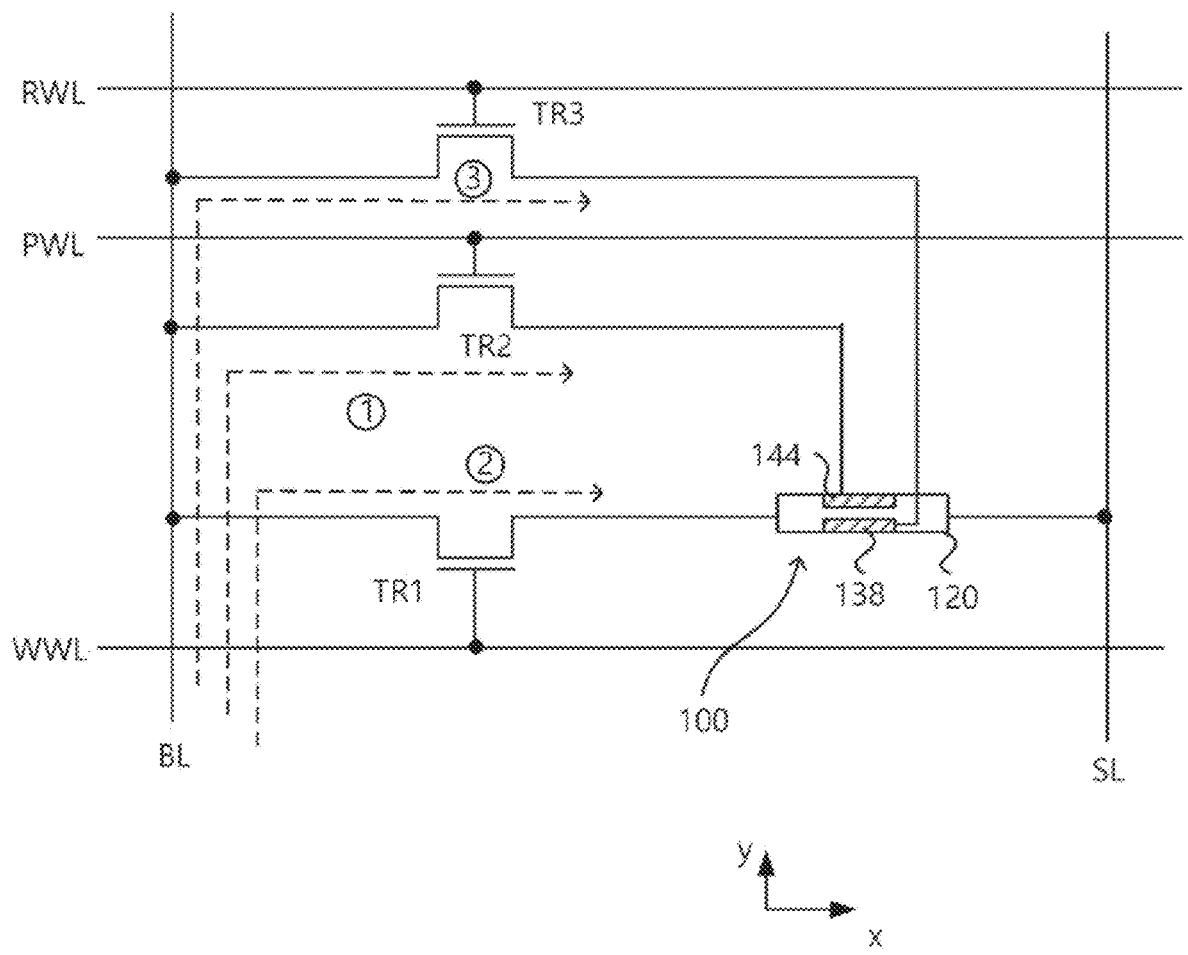
FIG. 15A is a circuit diagram describing a method for operating a magnetic device according to an embodiment of the inventive concept.
Figure 15B:
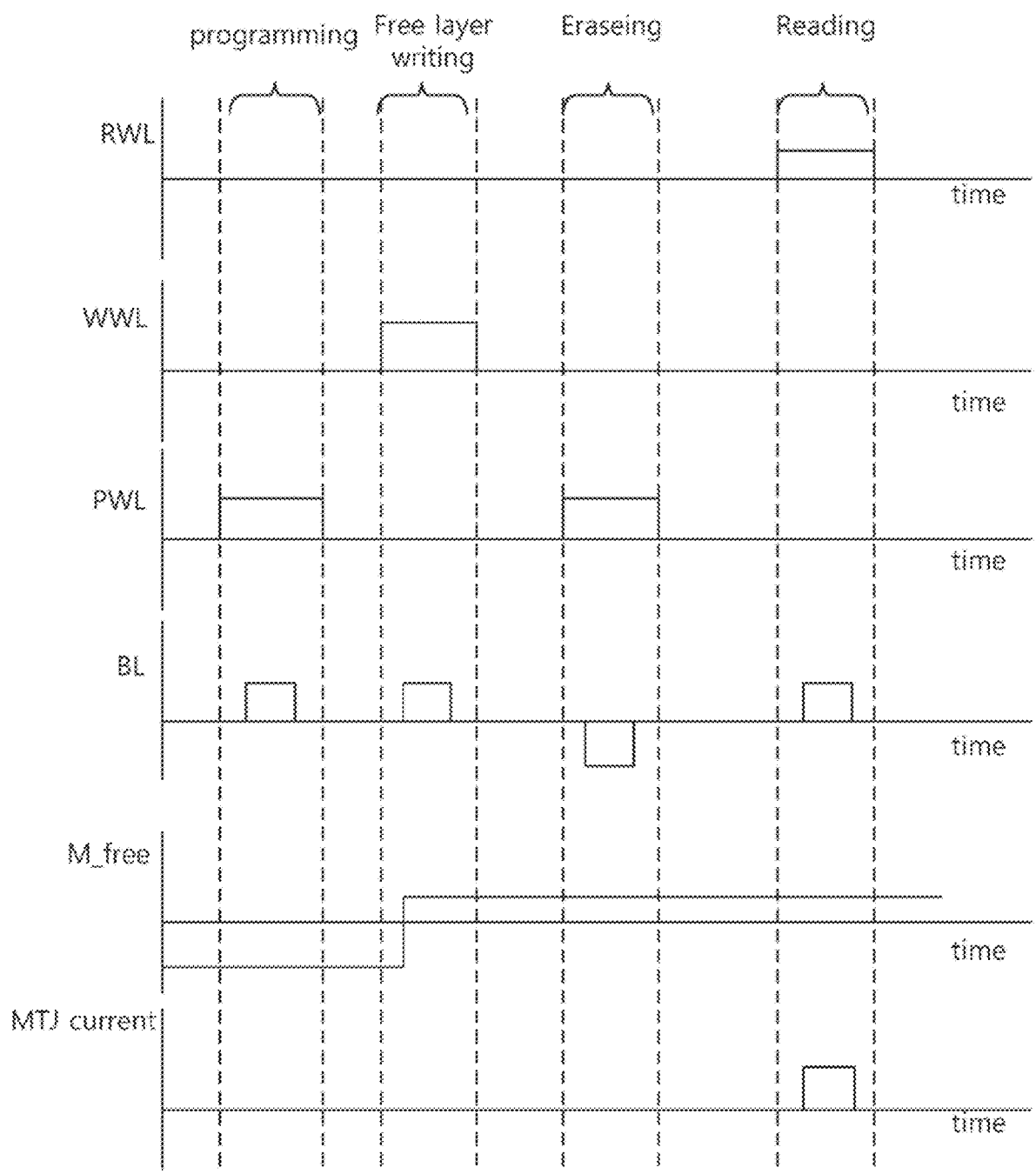
FIG. 15B is a timing diagram of a circuit of FIG. 15A.

FIG. 15A is a circuit diagram describing a method for operating a magnetic device according to an embodiment of the inventive concept FIG. 15B is a timing diagram of a circuit of FIG. 15A.

Referring to FIG. 15A and FIG. 15b, the magnetic device 100 includes the conductive layer 120 extended in the first direction (x axis direction) and providing a spin Hall effect on the placement plane (xy plane) defined by the first direction (x axis direction) and the second direction (y axis direction), the free layer 132 disposed on the conductive layer 120, the fixed layer 136 disposed on a portion of the free layer 132, the tunnel barrier layer 134 disposed between the free layer 132 and the fixed layer 136, the first electrode 138 disposed on the fixed layer 136, the first charge storage layer 142 disposed on the free layer 132 so as not to overlap the fixed layer 136, and the first gate electrode 144 disposed on the first charge storage layer 142. The first electrode 138 and the first gate electrode 144 are arranged in the second direction (y axis direction).

The conductive layer 120 is extended in the first direction (x axis), and an end of the conductive layer 120 may be connected to a source line SL which is extended in the y axis direction. The source line may be grounded. The other end of the conductive layer 120 is connected to a source of a first transistor TR1. A drain of the first transistor TR1 is connected to a bit line BL which is extended in the second direction. A gate of the first transistor TR1 is connected to a write word line WWL which is extended in the first direction.

The first gate electrode 144 is connected to a source of a second transistor TR2, and a drain of the second transistor TR2 is connected to the bit line. A gate of the second transistor TR2 is connected to a program word line PWL which is extended in the first direction.

The first electrode 138 is connected to a source of a third transistor TR3, and a drain of the third transistor TR3 is connected to the bit line BL. A gate of the third transistor TR3 is connected to a read word line RWL which is extended in the first direction.

In a programming step, a voltage is applied to the PWL to turn on the second transistor TR2, and a program voltage of the bit line BL is applied to the first gate electrode 144. Accordingly, charges are accumulated in or moved to the charge storage layer 142.

Thereafter, in a switching step, a voltage is applied to the WWL to turn on the first transistor TR1, and an in-plane current is applied to the conductive layer 120 through the bit line BL. Accordingly, the in-plane current and the charge storage layer 142 perform switching on the free layer 132.

Thereafter, in a reading step, a voltage is applied to the RWL to turn on the third transistor TR3, and by a read voltage of the bit line BL, a current flowing along a magnetic tunnel junction 101 and the bit line BL is detected.

Thereafter, in an erasing step, a voltage is applied to the PWL to turn on the second transistor TR2, and an erase voltage of the bit line BL is applied to the first gate electrode 144. Accordingly, the charges accumulated in the charge storage layer 142 are dissipated, or the charges moved to the charge storage layer are moved to another interface.

In the above embodiment, drains of the first to third transistors TR1, TR2, and TR3 are all connected to one bit line BL, but according to a modified embodiment of the inventive concept, the same may be respectively connected to separate bit lines BL1, BL2, and BL3.

A magnetic device according to an embodiment of the inventive concept may perform field-free switching by inducing an asymmetric charge distribution using at least one charge storage layer to generate a spin current (z-SOT) polarized in a perpendicular direction with respect to a free layer. The z-SOT enables field-free switching of perpendicular magnetization and electrical control of a switching polarity.

A magnetic device according to an embodiment of the inventive concept may perform reconfigurable logic operations by using reversible and non-volatile properties of field-free SOT switching which is electrically controlled.

Although the preferred embodiments of the inventive concept have been shown and described, the inventive concept is not limited to the specific embodiments described above, and includes various forms of embodiments which may be implemented within the scope not departing from the technical spirit of the inventive concept as claimed by those skilled in the art to which the inventive concept belongs.

What is claimed is:

1. A magnetic device comprising:
   a conductive layer extended in a first direction and providing a spin Hall effect on a placement plane defined by the first direction and a second direction;
   a free layer disposed on the conductive layer;
   a fixed layer disposed on a portion of the free layer;
   a tunnel barrier layer disposed between the free layer and the fixed layer;
   a first electrode disposed on the fixed layer;
   a first charge storage layer disposed on the free layer so as not to overlap the fixed layer; and
   a first gate electrode disposed on the first charge storage layer,
   wherein the first electrode and the first gate electrode are arranged in the second direction.

2. The magnetic device of claim 1, wherein:
   the first charge storage layer is an oxide film; and
   oxygen ions of the first charge storage layer generate a lateral modulation of the Rashba effect or an out-of-plane spin orbit torque by a voltage applied to the first gate electrode.

3. The magnetic device of claim 1, wherein:
   the first charge storage layer comprises fixed charges; and
   a voltage applied to the first gate electrode moves the fixed charges of the first charge storage layer.

4. The magnetic device of claim 1, wherein:
   the first charge storage layer comprises trapped charges; and
   charges are trapped in the first charge storage layer by a voltage applied to the first gate electrode.

5. The magnetic device of claim 1, further comprising an auxiliary tunnel barrier layer disposed between the first charge storage layer and the free layer.

6. The magnetic device of claim 1, wherein the tunnel barrier layer is extended to overlap the first charge storage layer.

7. The magnetic device of claim 1, wherein the first charge storage layer comprises a tunnel insulation layer, a floating conductive layer, and a blocking insulation layer sequentially stacked.

8. The magnetic device of claim 1, wherein the first charge storage layer comprises a tunnel insulation layer, a charge trapping layer, and a blocking insulation layer sequentially stacked.

9. The magnetic device of claim 1, further comprising:
   a second charge storage layer disposed on the free layer so as not to overlap the fixed layer and the first charge storage layer; and
   a second gate electrode disposed on the second charge storage layer,
   wherein the first gate electrode, the first electrode, and the second gate electrode are sequentially arranged in the second direction.

10. The magnetic device of claim 9, wherein the first charge storage layer and the second charge storage layer comprise a tunnel insulation layer, a charge trapping layer, and a blocking insulation layer sequentially stacked.

11. The magnetic device of claim 9, wherein the first charge storage layer and the second charge storage layer comprise fixed charges.

12. A method for operating a magnetic device including a conductive layer extended in a first direction and providing a spin Hall effect on a placement plane defined by the first direction and a second direction, a free layer disposed on the conductive layer, a fixed layer disposed on a portion of the free layer, a tunnel barrier layer disposed between the free layer and the fixed layer, a first electrode disposed on the fixed layer, a first charge storage layer disposed on the free layer so as not to overlap the fixed layer, and a first gate electrode disposed on the first charge storage layer, wherein the first electrode and the first gate electrode are arranged in the second direction, the method comprising:
   applying a first program gate voltage to the first gate electrode to accumulate charges in or move the charges to the first charge storage layer, thereby programming the first charge storage layer to a first program state;
   applying an in-plane current to the conductive layer to switch a magnetization direction of the free layer; and
   applying a read voltage to the first electrode to read tunnel resistance of a magnetic tunnel junction by the free layer/tunnel barrier layer/fixed layer.

13. The method of claim 12, further comprising at least one among:
   applying an erase gate voltage having an opposite polarity to the first program gate voltage to the first gate electrode to remove the first program state formed in the first charge storage layer;
   when the first charge storage layer is in an erase state, applying a second program gate voltage to the first gate electrode to accumulate charges in or move the charges to the first charge storage layer, thereby programming the first charge storage layer to a second program state;
   applying an in-plane current I_inplane to the conductive layer to switch the magnetization direction of the free layer; and
   applying an erase gate voltage having an opposite polarity to the second program gate voltage to the first gate electrode to remove the second program state formed in the first charge storage layer.

14. A method for operating a magnetic device including a conductive layer extended in a first direction and providing a spin Hall effect on a placement plane defined by the first direction and a second direction, a free layer disposed on the conductive layer, a fixed layer disposed on a portion of the free layer, a tunnel barrier layer disposed between the free layer and the fixed layer, a first electrode disposed on the fixed layer, a first charge storage layer disposed on the free layer so as not to overlap the fixed layer, a first gate electrode disposed on the first charge storage layer, a second charge storage layer disposed on the free layer so as not to overlap the fixed layer and the first charge storage layer; and a second gate electrode disposed on the second charge storage layer, wherein the first gate electrode, the first electrode, and the second gate electrode are sequentially arranged in the second direction, the method comprising:
   applying a first program gate voltage to the first gate electrode to accumulate charges in or move the charges to the first charge storage layer, thereby programming the first charge storage layer to a first program state;
   applying an in-plane current to the conductive layer to switch the magnetization direction of the free layer; and
   applying a read voltage to the first electrode to read tunnel resistance of a magnetic tunnel junction by the free layer/tunnel barrier layer/fixed layer.

15. The method of claim 14, further comprising applying an erase gate voltage having an opposite polarity to the first program gate voltage to the first gate electrode to remove the first program state formed in the first charge storage layer.

\* \* \* \* \*